United States Patent
Lee

(10) Patent No.: US 11,217,302 B2
(45) Date of Patent: Jan. 4, 2022

(54) THREE-DIMENSIONAL NEUROMORPHIC DEVICE INCLUDING SWITCHING ELEMENT AND RESISTIVE ELEMENT

(71) Applicant: SAMSUNG ELECTRONICS CO., LTD., Suwon-si (KR)

(72) Inventor: Kwangjin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/942,928

(22) Filed: Jul. 30, 2020

(65) Prior Publication Data

US 2021/0183438 A1 Jun. 17, 2021

(30) Foreign Application Priority Data

Dec. 13, 2019 (KR) .................... 10-2019-0166754

(51) Int. Cl.
  *G11C 11/54* (2006.01)
  *G06N 3/063* (2006.01)
  *G11C 13/00* (2006.01)
(52) U.S. Cl.
  CPC ............ *G11C 11/54* (2013.01); *G06N 3/0635* (2013.01); *G11C 13/0004* (2013.01)
(58) Field of Classification Search
  CPC .... G11C 11/54; G11C 13/0004; G06N 3/0635
  See application file for complete search history.

(56) References Cited

U.S. PATENT DOCUMENTS

| 8,447,714 B2 | 5/2013 | Breitwisch et al. |
| 2017/0337466 A1 | 11/2017 | Bayat et al. |
| 2018/0232628 A1 | 8/2018 | Park et al. |
| 2018/0300618 A1 | 10/2018 | Obradovic et al. |
| 2018/0300626 A1 | 10/2018 | Lee |
| 2019/0035449 A1 | 1/2019 | Saida et al. |

(Continued)

FOREIGN PATENT DOCUMENTS

KR 1020190075682 A 7/2019

OTHER PUBLICATIONS

I. Wang, T. Chou, Li-Wen Chiu, Chih-Cheng Chang and Tuo-Hung Hou, "Development of three-dimensional synaptic device and neuromorphic computing hardware," 2016 13th IEEE International Conference on Solid-State and Integrated Circuit Technology (ICSICT), Hangzhou, China, 2016, pp. 620-623. (Year: 2016).*

(Continued)

*Primary Examiner* — Ajay Ojha
(74) *Attorney, Agent, or Firm* — Sughrue Mion, PLLC

(57) ABSTRACT

A neuromorphic device, including a controller configured to generate ternary data by converting each bit of binary data into a ternary bit; and a memory device configured to store the ternary data, wherein the memory device includes: a first memory cell array including first memory cells formed between lower word lines and bit lines, wherein a first memory cell of the first memory cells includes a first switching element and a first resistive element; and a second memory cell array including second memory cells formed between upper word lines and the bit lines, wherein a second memory cell of the second memory cells includes a second switching element and a second resistive element, and wherein each bit of the ternary data is identified by a combination of a data bit stored in the first memory cells and a mask bit stored in the second memory cells.

19 Claims, 14 Drawing Sheets

(56) References Cited

U.S. PATENT DOCUMENTS

| | | |
|---|---|---|
| 2019/0154493 A1 | 5/2019 | Hatcher et al. |
| 2019/0156194 A1 | 5/2019 | Burr |
| 2019/0164046 A1 | 5/2019 | Song et al. |
| 2019/0236445 A1* | 8/2019 | Das .................. G06N 3/063 |
| 2020/0035305 A1* | 1/2020 | Choi .................. G06N 3/063 |
| 2020/0356848 A1* | 11/2020 | Lesso ................ G11C 13/004 |
| 2021/0050060 A1* | 2/2021 | Li ...................... G11C 8/12 |

* cited by examiner

THREE-DIMENSIONAL NEUROMORPHIC DEVICE INCLUDING SWITCHING ELEMENT AND RESISTIVE ELEMENT

CROSS-REFERENCE TO THE RELATED APPLICATION

This application claims priority under 35 U.S.C. § 119 to Korean Patent Application No. 10-2019-0166754 filed on Dec. 13, 2019, in the Korean Intellectual Property Office, the disclosure of which is incorporated by reference herein in its entirety.

BACKGROUND

1. Field

The disclosure relates to a neuromorphic device, and more particularly, to a three-dimensional neuromorphic device including a switching element and a resistive element.

2. Description of Related Art

Semiconductor memories may be classified into volatile memory devices, which lose data stored therein when a power supply voltage is turned off, such as a static random access memory (SRAM), a dynamic RAM (DRAM), and a synchronous DRAM (SDRAM), and nonvolatile memory devices, which retain data stored therein even when a power supply voltage is turned off, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

Various elements may be used to improve the performance of a memory-based storage device. In particular, a phase change element may use a material having a chalcogenide element, and an ovonic threshold switch may be used. In addition, a neuromorphic device for modeling a human brain by using various memory elements is being actively developed.

SUMMARY

Embodiments provide a three-dimensional neuromorphic device using a phase change element and an ovonic threshold switch.

Embodiments provide an efficient data storing method and an efficient data reading method of the three-dimensional neuromorphic device.

According to an exemplary embodiment, a neuromorphic device includes a controller configured to generate ternary data by converting each bit of binary data into a ternary bit; and a memory device configured to store the ternary data, wherein the memory device includes: a first memory cell array including first memory cells formed between lower word lines and bit lines, wherein a first memory cell of the first memory cells includes a first switching element and a first resistive element; and a second memory cell array including second memory cells formed between upper word lines and the bit lines, wherein a second memory cell of the second memory cells includes a second switching element and a second resistive element, and wherein each bit of the ternary data is identified by a combination of a data bit stored in the first memory cells and a mask bit stored in the second memory cells.

According to an exemplary embodiment, a neuromorphic device includes a controller configured to receive presynaptic values corresponding to output signals of presynaptic neurons from outside of the neuromorphic device and to calculate weight values based on the presynaptic values; and a memory device including a first memory cell array and a second memory cell array, wherein the first memory cell array includes first memory cells formed between lower word lines and bit lines, and wherein a first memory cell of the first memory cells includes a first switching element and a first resistive element, wherein the second memory cell array includes second memory cells formed between the bit lines and upper word lines, and wherein a second memory cell of the second memory cells includes a second switching element and a second resistive element, wherein the first memory cell corresponds to the second memory cell, wherein the first memory cell and the second memory cell are connected in common with a same bit line of the bit lines, and wherein the presynaptic values are stored to the first memory cell array, and the weight values are stored to the second memory cell array.

According to an exemplary embodiment, a memory device for neuromorphic calculation, includes a first plurality of tiles including a first plurality of memory cells; a second plurality of tiles formed on the first plurality of tiles and including a second plurality of memory cells; first write drivers respectively corresponding to the first plurality of tiles; first sense amplifiers respectively corresponding to the first plurality of tiles; second write drivers respectively corresponding to the second plurality of tiles; and second sense amplifiers respectively corresponding to the second plurality of tiles, wherein the first plurality of memory cells are formed between lower word lines and bit lines and the second plurality of memory cells are formed between the bit lines and upper word lines, wherein each of the first plurality of memory cells and the second plurality of memory cells includes a switching element and a resistive element, and wherein presynaptic values corresponding to output signals of presynaptic neurons are stored to the first plurality of memory cells and weight values based on the presynaptic values are stored to the second plurality of memory cells.

BRIEF DESCRIPTION OF THE FIGURES

The above and other objects and features of embodiments will become apparent from the following description taken in conjunction with the accompanying drawings, in which.

DETAILED DESCRIPTION

Below, embodiments may be described in detail and clearly to such an extent that a person of ordinary skill in the relevant art may easily implement the inventive concept. The embodiments described herebelow are all exemplary, and thus, the inventive concept is not limited to these embodiments disclosed below and may be realized in various other forms.

Components that are described in the detailed description with reference to the terms "unit", "module", "block", "~er or ~or", etc. and function blocks illustrated in drawings may be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

A neuromorphic device of the present disclosure may operate based on a neural network in which a plurality of neurons and a plurality of synapses are implemented. Based on the neural network, the neuromorphic device may perform learning on input data or may perform inference on the input data. Through the learning and inference of the input data, the neuromorphic device may perform various operations such as a character recognition operation, a voice recognition operation, a danger recognition operation, and a real-time high-speed signal processing operation.

Figure 1:
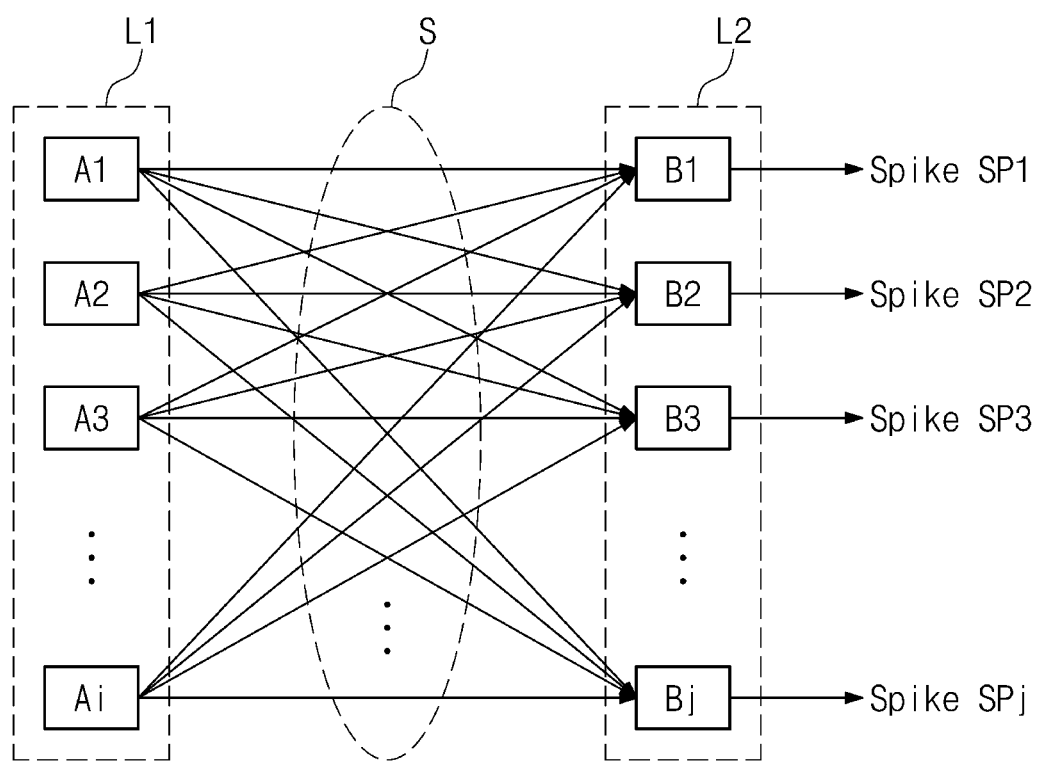
FIG. 1 conceptually illustrates a neural network according to an embodiment.

FIG. 1 conceptually illustrates a neural network according to an embodiment.

A neural network 10 may include presynaptic neurons A1 to Ai, postsynaptic neurons B1 to Bj, and synapses "S". The synapses "S" may connect the presynaptic neurons A1 to Ai and the postsynaptic neurons B1 to Bj. The presynaptic neurons A1 to Ai may be included in a first layer L1 of the neural network 10, and the postsynaptic neurons B1 to Bj may be included in a second layer L2 of the neural network 10. The first layer L1 may include "i" presynaptic neurons A1 to Ai, and the second layer L2 may include "j" postsynaptic neurons B1 to Bj. Here, "i" and "j" may be any integer, and "i" and "j" may be equal to each other or different from each other.

The presynaptic neurons A to Ai of the first layer L1 may output respective spikes. The synapses "S" may transfer signals to the postsynaptic neurons B1 to Bj of the second layer L2 based on the output spikes. Even though a spike may be output from one presynaptic neuron, each of the signals that are transferred from the synapses "S" to the postsynaptic neurons B1 to Bj may vary depending on synaptic weight values indicating the connection strength of each of the synapses "S". For example, based on a synaptic weight value of a synapse connecting the first presynaptic neuron A1 and the first postsynaptic neuron B1 is greater than a synaptic weight value of a synapse connecting the first presynaptic neuron A1 and the second postsynaptic neuron B2, the first postsynaptic neuron B1 may receive a signal of a greater value than the second postsynaptic neuron B2.

The postsynaptic neurons B1 to Bj of the second layer L2 may receive signals transferred from the synapses "S" and may output spikes based on the received signals. In an embodiment, when an accumulation value of received signals is greater than a threshold value, each of the postsynaptic neurons B1 to Bj may output a spike, for example spike SP through spike SPj.

For example, as illustrated in FIG. 1, based on the second presynaptic neuron A2 outputting a spike, the synapses "S" connected with the second presynaptic neuron A2 may transfer signals to the postsynaptic neurons B1 to Bj. The transferred signals may vary depending on synaptic weight values of the synapses "S" connected with the second presynaptic neuron A2. Based on a signal being transferred to the second postsynaptic neuron B2 from a synapse connecting the second presynaptic neuron A2 and the second postsynaptic neuron B2 and an accumulation signal value of the second postsynaptic neuron B2 becoming greater than the threshold value by the transferred signal, the second postsynaptic neuron B2 may output a spike, for example spike SP2.

As described above, a presynaptic neuron may refer to a neuron that outputs a spike to transfer a signal to a neuron of a next layer, and a postsynaptic neuron may refer to a neuron that receives a signal corresponding to a spike of a neuron of a previous layer. In embodiments, one neuron may perform a role of both a presynaptic neuron and a postsynaptic neuron.

An example illustrated in FIG. 1 as the neural network 10 includes the first layer L1 and the second layer L2, but the disclosure is not limited thereto. For example, the number of layers included in the neural network 10 may be variously changed. Regardless of the number of layers, each layer may operate to be similar to the manner described with reference to FIG. 1. Accordingly, the neural network 10 of FIG. 1 may be expanded to a neural network including two or more layers.

Figure 2:
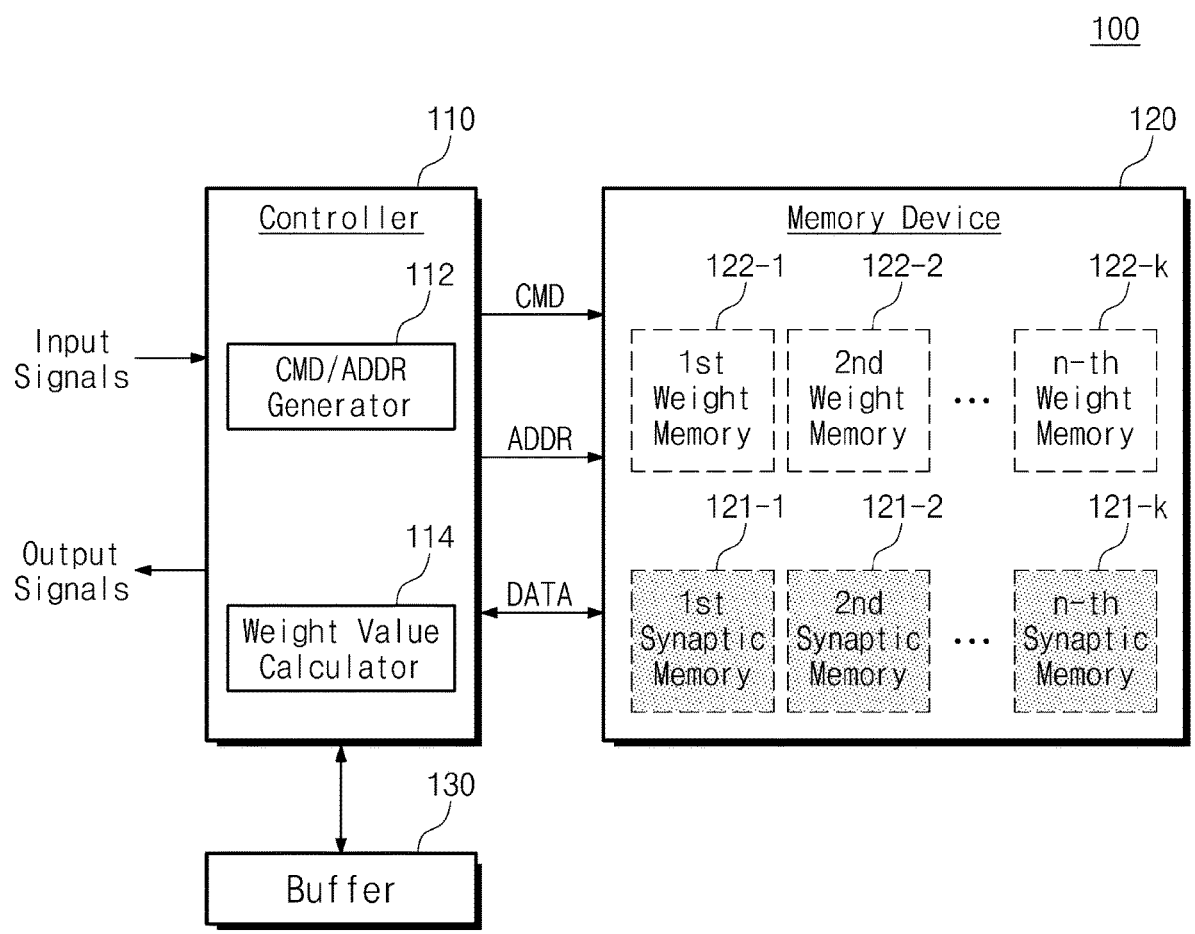
FIG. 2 illustrates an exemplary configuration of a neuromorphic device according to an embodiment.

FIG. 2 illustrates an exemplary configuration of a neuromorphic device of the present disclosure. A neuromorphic device 100 may include a controller 110, a memory device 120, and a buffer 130. The neuromorphic device 100 may operate based on the neural network 10 of FIG. 1.

Referring to FIG. 2, the controller 110 may manage overall operations of the neuromorphic device 100. The controller 110 may receive input signals corresponding to spikes output from the presynaptic neurons A1 to Ai, as shown for example in FIG. 1. For example, the controller 110 may store the received input signals to the buffer 130. The controller 110 may calculate weight values based on the received input signals or may receive weight values from the outside. The controller 110 may store values of the input signals, and/or weight values to the memory device 120. In addition, the controller 110 may read a result of neuromorphic calculation performed in the memory device 120 and may output the read result of the neuromorphic calculation to the outside as output signals. For the above operations, in an embodiment, the controller 110 may include a command and address generator 112 and a weight value calculator 114.

The command and address generator 112 may generate a command CMD and an address ADDR for the purpose of storing values of the received input signals to the memory device 120 as data DATA. The controller 110 may generate the command CMD and the address ADDR for the purpose of reading the data DATA stored in the memory device 120. For example, the controller 110 may independently manage values of input signals, values of output signals, and weight values. For example, the controller 110 may store and manage values of input signals and values of output signals in synaptic memories 121-1 to 121-$k$ and may store and manage weight values in weight memories 122-1 to 122-$k$. However, the number of synaptic memories and the number of weight memories may be different from each other.

The weight value calculator 114 may calculate a weight value corresponding to the connection strength of a presynaptic neuron and a postsynaptic neuron. For example, the weight value calculator 114 may calculate a weight value in the neuromorphic device 100 instead of receiving a weight value from the outside. A weight value may be determined by various factors. For example, a weight value may depend on various factors such as attributes of each of input signals, a size of each of the input signals, how frequently each of the input signals is received, etc.

In an embodiment, input signals may be received from an image sensor or a dynamic vision sensor (DVS). Based on a size of a signal received from a pixel at specific coordinates (or an average value of signals) being a specific value or more, the weight value calculator 114 may calculate a weight value having a relatively large value. Based on a frequency at which signals are received from a pixel at specific coordinates being a specific value or more, the weight value calculator 114 may calculate a weight value having a relatively large value. Based on signals being received from a pixel corresponding to a specific color, the weight value calculator 114 may calculate a weight value having a relatively large value. However, a weight value may be determined by various factors, and a factor to determine a weight value is not limited thereto.

When weight values are completely calculated by the weight value calculator 114, the command and address generator 112 may generate a command and an address for storing the weight values to the weight memories 122-1 to 122-$k$, and the controller 110 may store the weight values to the weight memories 122-1 to 122-$k$.

The memory device 120 may operate based on the command and the address received from the controller 110. The memory device 120 may include one or more memory cell arrays. The memory device 120 may include the plurality of synaptic memories 121-1 to 121-$k$ and the plurality of weight memories 122-1 to 122-$k$. For example, in the case where the memory device 120 is implemented with a plurality of memory cell arrays, the plurality of synaptic memories 121-1 to 121-$k$ and the plurality of weight memories 122-1 to 122-$k$ may be implemented with different arrays, respectively.

In an embodiment, the plurality of synaptic memories 121-1 to 121-$k$ may distribute and store values of signals output from presynaptic neurons of the presynaptic layer L1, as shown for example in FIG. 1. As values of signals are distributed and stored, parallel processing of the signals may be possible. For example, a signal received from the first presynaptic neuron A1 of the presynaptic layer L1 may be stored to the first synaptic memory 121-1, and a signal received from the second presynaptic neuron A2 may be stored to the second synaptic memory 121-2. As in the above description, there may be stored signals received from the remaining presynaptic neurons A3 to Ai.

In another embodiment, the plurality of synaptic memories 121-1 to 121-$k$ may store values of signals output from different layers, respectively. For example, the first synaptic memory 121-1 may correspond to the presynaptic layer L1 and may store input signals. The second synaptic memory 121-2 may correspond to the postsynaptic layer L2, as shown for example in FIG. 1, and may store values of signals output from the postsynaptic layer L2. As in the above description, the third synaptic memory 121-3 may store values of signals output from a layer following the postsynaptic layer L2. The above description may also be applied to the remaining synaptic memories.

In an embodiment, the plurality of weight memories 122-1 to 122-$k$ may store weight values of synapses connecting different layers. For example, the first weight memory 122-1 may store weight values corresponding to a synapse between the presynaptic layer L1 and the postsynaptic layer L2. The second weight memory 122-2 may store weight values corresponding to a synapse between the postsynaptic layer L2 and a layer following the postsynaptic layer L2. The above description may also be applied to the remaining weight memories.

Each of the plurality of synaptic memories 121-1 to 121-$k$ and the plurality of weight memories 122-1 to 122-$k$ may be implemented with a volatile memory device, such as a static RAM (SRAM), a dynamic RAM (DRAM), or a synchronous DRAM (SDRAM), and/or a nonvolatile memory device, such as a read only memory (ROM), a programmable ROM (PROM), an electrically programmable ROM (EPROM), an electrically erasable and programmable ROM (EEPROM), a phase-change RAM (PRAM), a magnetic RAM (MRAM), a resistive RAM (RRAM), a ferroelectric RAM (FRAM), or a flash memory. In various embodiments described herein, the memory device 120 will be described based on the PRAM.

The plurality of synaptic memories 121-1 to 121-$k$ and the plurality of weight memories 122-1 to 122-$k$ may operate individually. For example, the synaptic memories 121-1 to 121-$k$ may be implemented with one memory cell array, and the synaptic memories 121-1 to 121-$k$ may be connected with different drivers and different sense amplifiers. Similarly, the weight memories 122-1 to 122-$k$ may be implemented with one memory cell array, and the weight memories 122-1 to 122-$k$ may be connected with different drivers and different sense amplifiers. For example, each of the plurality of synaptic memories 121-1 to 121-$k$ and the plurality of weight memories 122-1 to 122-$k$ may be referred to as a "tile". A tile structure will be described in greater detail below.

Figure 3:
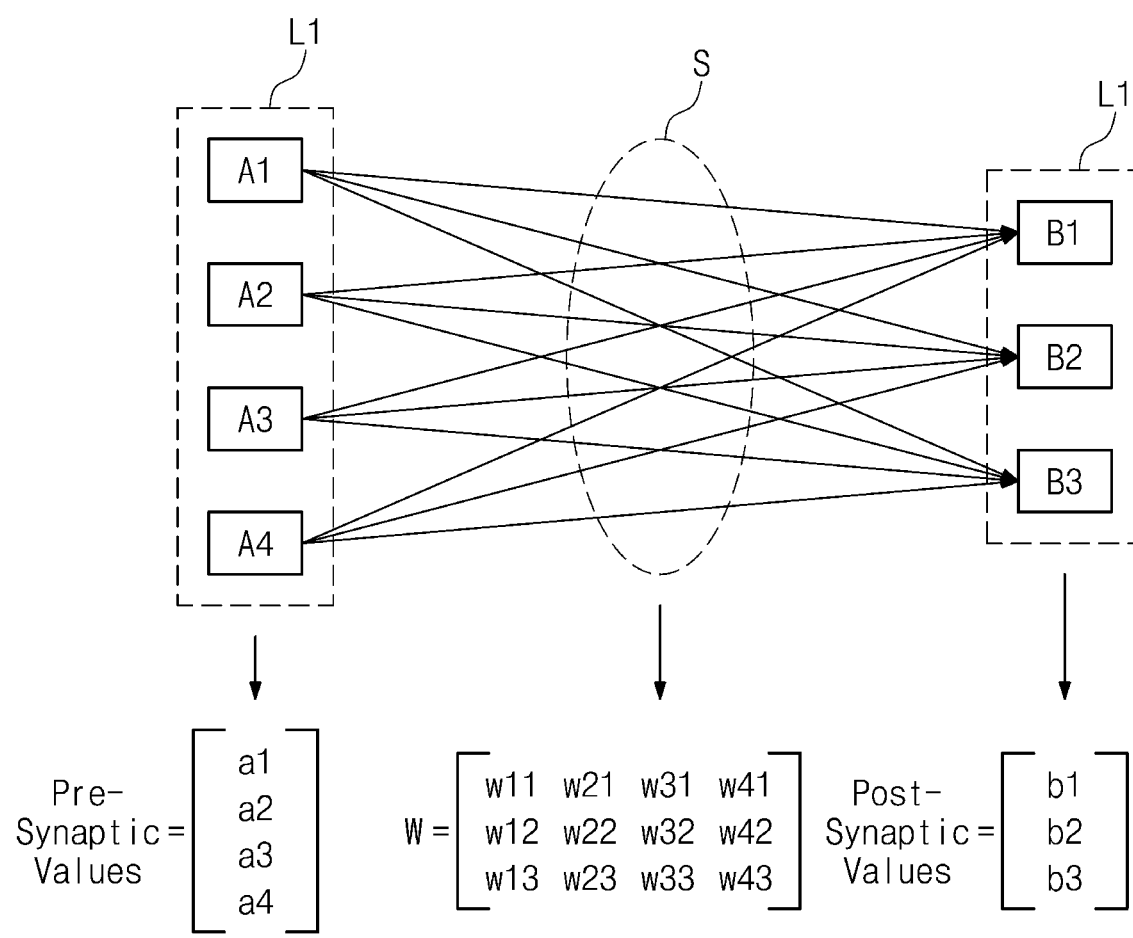
FIG. 3 conceptually illustrates weight values in a neural network of FIG. 1 according to an embodiment.

FIG. 3 conceptually illustrates weight values in a neural network of FIG. 1.

The neural network 10 includes the first layer L1, the second layer L2, and the synapses "S". The first layer L1 may include the first to fourth presynaptic neurons A1 to A4, and the second layer L2 may include the first to third postsynaptic neurons B1 to B3. The synapses "S" may connect the first to fourth presynaptic neurons A1 to A4 of the first layer L1 and the first to third postsynaptic neurons B1 to B3 of the second layer L2. Accordingly, there may be twelve synapses "S" connecting the first to fourth presynaptic neurons A1 to A4 and the first to third postsynaptic neurons B1 to B3. As illustrated in FIG. 3, values of signals that are output from the presynaptic neurons A1 to A4 may be expressed by a1 to a4, respectively. Below, a value of a signal output from a presynaptic neuron may be referred to as a "presynaptic value". Synaptic weights w11 to w43 corresponding to the synapses "S" may be expressed in the form of a weight matrix. Values of signals that are output from the postsynaptic neurons B1 to B3 may be expressed by b1 to b3, respectively. Below, a value of a signal output from a postsynaptic neuron may be referred to as a "postsynaptic value".

The weight values w11 to w41 at the first row of a weight matrix "W" may correspond to synapses connecting the presynaptic neurons A1 to A4 and the first postsynaptic neuron B1. For example, a synaptic weight value corresponding to a synapse connecting the first presynaptic neuron A1 and the first postsynaptic neuron B1 may be w11. The weight values w12 to w42 at the second row of the weight matrix "W" may correspond to synapses connecting the presynaptic neurons A1 to A4 and the second postsynaptic neuron B2. As in the above description, the weight values w13 to w43 at the third row may correspond to synapses connecting the presynaptic neurons A1 to A4 and the third postsynaptic neuron B3.

As illustrated in FIG. 3, synaptic weight values between the four presynaptic neurons A1 to A4 and the three postsynaptic neurons B1 to B3 may be expressed by a 3×4 weight matrix "W". That is, synaptic weight values between j presynaptic neurons and i postsynaptic neurons may be expressed by an i×j weight matrix. Below, for ease of description, an operation of a neuromorphic device will be described based on the neural network of FIG. 3. That is, the operation of the neuromorphic device will be described based on the synaptic weight values w11 to w43 that are expressed by the 3×4 weight matrix "W".

Figure 4:
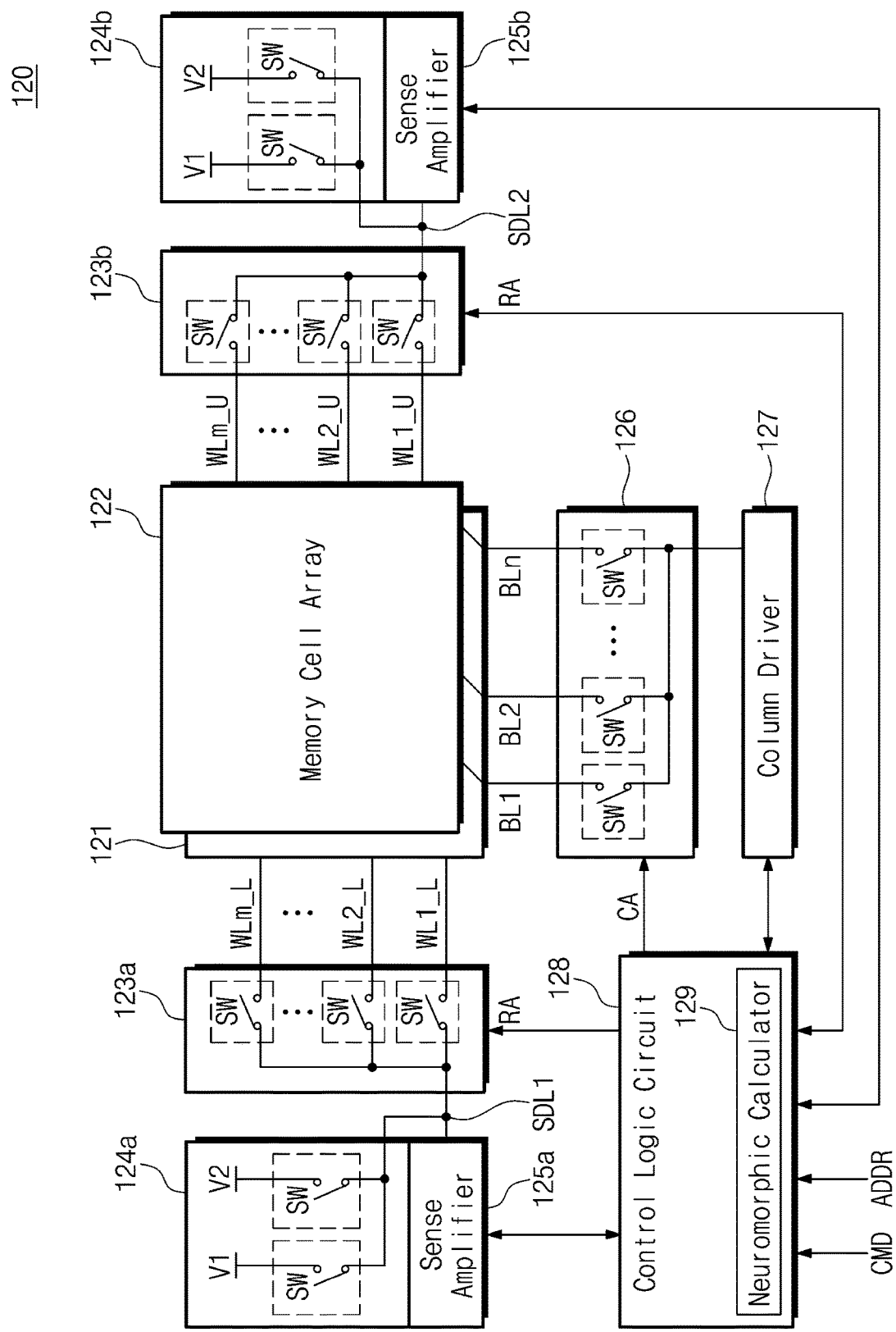
FIG. 4 illustrates an exemplary configuration of a memory device of FIG. 2 according to an embodiment.

FIG. 4 illustrates an exemplary configuration of the memory device 120 of FIG. 2. The memory device 120 may include first and second memory cell arrays 121 and 122 including memory cells, first and second row decoders 123a and 123b, first and second write drivers 124a and 124b, first and second sense amplifiers 125a and 125b, a column decoder 126, a column driver 127, and a control logic circuit 128.

The first memory cell array 121 and the second memory cell array 122 may include phase change memory cells. The first memory cell array 121 and the second memory cell array 122 may have substantially the same structure. The memory cells of the first memory cell array 121 may be connected with lower word lines. The memory cells of the second memory cell array 122 may be connected with upper word lines. The memory cells of the first and second memory cell arrays 121 and 122 may be connected with bit lines BL1 to BLn.

The first row decoder 123a may include switches SW respectively connected with lower word lines WL1_L to WLm_L. For example, the number of switches included in the first row decoder 123a may be equal to the number of lower word lines. The first row decoder 123a may control a switch connected with a selected word line in response to a row address RA received from the control logic circuit 128. A selected switch may electrically connect a word line indicated by the row address RA and a first sensing data line SDL1. The first row decoder 123a may apply various voltages output from the first write driver 124a to a selected word line or an unselected word line.

The first write driver 124a may be associated with a write operation of the first memory cell array 121. The first write driver 124a may be connected with the first sensing data line SDL1. The first write driver 124a may include switches SW for providing voltages of various levels to the lower word lines WL1_L to WLm_L.

Under control of the control logic circuit 128, the first write driver 124a may output a voltage of a precharge level V1 that is used to precharge or discharge the lower word lines WL1_L to WLm_L. Under control of the control logic circuit 128, the first write driver 124a may output a voltage of a precharge level V2 that is used to precharge or discharge the first sensing data line SDL1. Under control of the control logic circuit 128, the first write driver 124a may output a non-selection word line voltage to be applied to an unselected word line of the lower word lines WL1_L to WLm_L, a program word line voltage to be applied to a selected word line thereof, etc. The first write driver 124a may provide the above voltages to the first row decoder 123a through the first sensing data line SDL1 or any other lines.

The first sense amplifier 125a may be connected with the first sensing data line SDL1. The first sense amplifier 125a may sense a voltage level of the first sensing data line SDL1 and may provide a sensing result to the control logic circuit 128. For example, a voltage level of the first sensing data line SDL1 may be equal to a voltage level of a selected word line, by the charge sharing between the selected word line and the first sensing data line SDL1.

The column decoder 126 may include switches SW respectively connected to the bit lines BL1 to BLn. For example, the number of switches included in the column decoder 126 may be equal to the number of bit lines BL1 to BLn. The column decoder 126 may control a switch connected with a bit line in response to a column address CA received from the control logic circuit 128. The column decoder 126 may apply various voltages output from the column driver 127 to a selected bit line or an unselected bit line.

The column driver 127 may provide voltages of various levels associated with a read operation and a write operation of the memory cell arrays 121 and 122. For example, under control of the control logic circuit 128, the column driver 127 may provide a write voltage and a read voltage to be applied to a selected bit line of the bit lines BL1 to BLn and may provide a non-selection bit line voltage, an initial bit line voltage, etc. to be applied to an unselected bit line thereof.

The control logic circuit 128 may control the row decoders 123a and 123b, the write drivers 124a and 124b, the sense amplifiers 125a and 125b, the column decoder 126, and the column driver 127. In the read operation, the control logic circuit 128 may control levels of voltages to be applied to a selected memory cell or an unselected memory cell, times when the voltages are applied thereto, the order of applying the voltages thereto, etc. In the write operation, the control logic circuit 128 may control levels of voltages to be applied to a selected memory cell or an unselected memory cell, times when the voltages are applied thereto, the order of applying the voltages thereto, etc. To this end, the control logic circuit 128 may decode the command CMD received from the controller 110, as shown for example in FIG. 2, and may generate control signals for controlling the above components. In addition, the control logic circuit 128 may decode the column address CA and the row address RA based on the address ADDR received from the controller 110.

The control logic circuit 128 may include a neuromorphic calculator 129. The neuromorphic calculator 129 may perform matrix multiplication on the presynaptic values a1 to a4 and the synaptic weight values w11 to w43 described with reference to FIG. 3. To this end, the neuromorphic calculator 129 may include various logic circuits such as an adder, a subtractor, and a multiplier. In an embodiment, the neuromorphic calculator 129 may include a dedicated circuit, an embedded field-programmable gate array (FPGA), etc. for the purpose of performing matrix multiplication.

In an embodiment, the second row decoder 123*b* may have substantially the same structure and/or function of the first row decoder 123*a*, the second write driver 124*b* may have substantially the same structure and/or function of the first write driver 124*a*, and the second sense amplifier 125*b* may have substantially the same structure and/or function of the first sense amplifier 125*a*. However, the second row decoder 123*b*, the second write driver 124*b*, and the second sense amplifier 125*b* may be associated with the second memory cell array 122. Therefore, with regard to the second row decoder 123*b*, the second write driver 124*b*, and the second sense amplifier 125*b*, additional description will be omitted to avoid redundancy.

Figure 5:
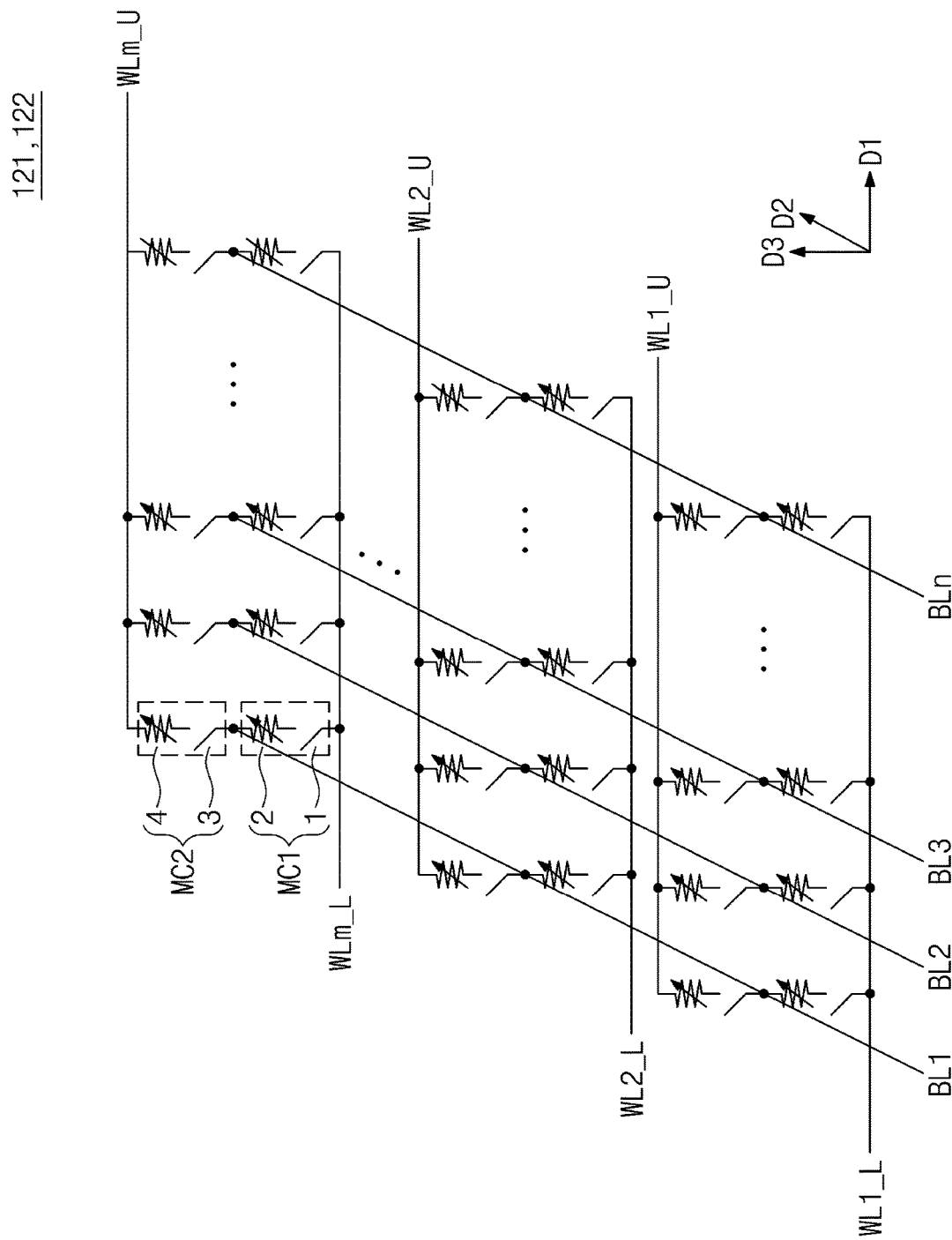
FIG. 5 illustrates a circuit diagram of memory cell arrays of FIG. 4 according to an embodiment.

FIG. 5 illustrates a circuit diagram of elements included in the memory cell arrays 121 and 122 of FIG. 4.

The first memory cell array 121 includes first-type memory cells MC1. Each of the memory cells MC1 of the first memory cell array 121 includes a switching element 1 and a resistive element 2. For example, the first-type memory cells MC1 may be arranged in rows and columns along a first direction D1 and a second direction D2. First ends of the switching elements 1 of the memory cells MC1 disposed at the first row may be connected with the first lower word line WL1_L. First ends of the resistive elements 2 of the memory cells MC1 disposed at the first row may be respectively connected with the bit lines BL1 to BLn. Second ends of the switching elements 1 may be connected with second ends of the resistive elements 2. The first-type memory cells MC1 disposed at the remaining rows may be connected in a similar manner.

The second memory cell array 122 includes second-type memory cells MC2. Each of the memory cells MC2 of the second memory cell array 122 includes a switching element 3 and a resistive element 4. For example, the second-type memory cells MC2 may be arranged in rows and columns along the first direction D1 and the second direction D2. First ends of the resistive elements 4 of the memory cells MC2 disposed at the first row may be connected with the first upper word line WL1_U. First ends of the switching elements 3 of the memory cells MC2 disposed at the first row may be respectively connected with the bit lines BL1 to BLn. Second ends of the switching elements 3 may be connected with second ends of the resistive elements 4. The second-type memory cells MC2 disposed at the remaining rows may be connected in a similar manner.

The first-type memory cells MC1 and second-type memory cells MC2 included in the memory cell arrays 121 and 122 may have a three-dimensional structure. In an embodiment, the first-type memory cells MC1 may be formed at a first floor between the lower word lines WL1_L to WLm_L and the bit lines BL1 to BLn. The second-type memory cells MC2 may be formed at a second floor between the bit lines BL1 to BLn and upper word lines WL_U to WLm_U. That is, the second-type memory cells MC2 may be formed on the first-type memory cells MC1 along a third direction D3. The first-type memory cell MC1 and the second-type memory cell MC2 disposed at one row and one column may share a bit line.

Each of the switching elements 1 and 3 may be an ovonic threshold switch (OTS) element having a bidirectional characteristic. For example, the OTS element may have a switching characteristic in which a resistance is high at a voltage smaller than a threshold voltage and is low at a voltage greater than or equal to the threshold voltage.

Each of the resistive elements 2 and 4 may include a phase change material. For example, the resistive elements 2 and 4 may include a material having a chalcogenide element. As a phase of a phase change material is changed by an electrical signal applied to each of the resistive elements 2 and 4, that is, the Joules's heat, the memory cells MC1 and MC2 may be programmed. For example, a phase change material may have a high-resistance state corresponding to an amorphous state and a low-resistance state corresponding to a crystalline state.

In another embodiment, positions of the switching element 1 and the resistive element 2 may be interchanged. That is, unlike the example illustrated in FIG. 5, one end of the resistive element 2 may be connected with a lower word line, and one end of the switching element 1 may be connected with a bit line. Also, positions of the switching element 3 and the resistive element 4 may be interchanged. That is, one end of the resistive element 4 may be connected with a bit line, and one end of the switching element 3 may be connected with an upper word line.

Figure 6:
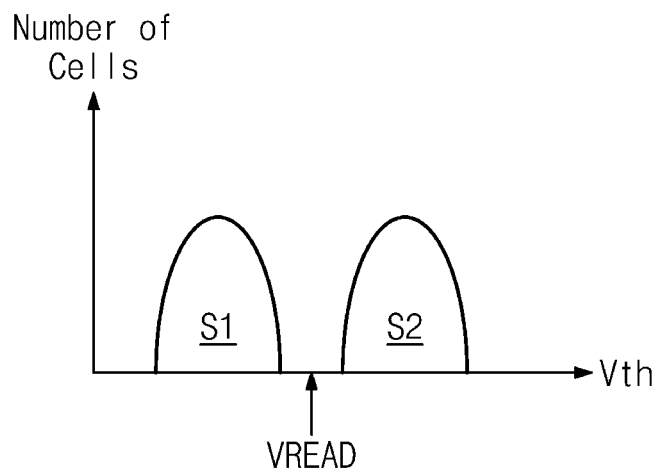
FIG. 6 illustrates a distribution of threshold voltages of memory cells of FIG. 5 according to an embodiment.
Figure 7:
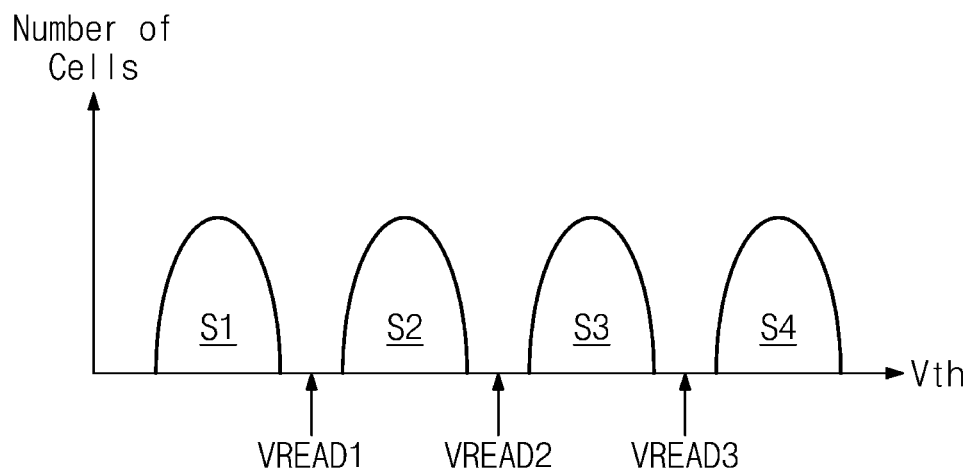
FIG. 7 illustrates a distribution of threshold voltages of memory cells of FIG. 5 according to an embodiment.

FIG. 6 illustrates a distribution of threshold voltages of the memory cells MC1 of FIG. 5. FIG. 7 illustrates a distribution of threshold voltages of the memory cells MC2 of FIG. 5. A horizontal axis represents a threshold voltage of a memory cell, and a vertical axis represents the number of memory cells. Due to various factors such as process, voltage, and temperature (PVT) variations, a write (or program) condition, a read condition, a write count, a read count, and an elapsed time, threshold voltages of memory cells having the same program state may not fully coincide and may be distributed within a specific range.

Referring to FIGS. 5 and 6, the first-type memory cell MC1 of the first memory cell array 121 may be a single level cell (SLC) storing one bit. That is, the memory cell MC1 may have a threshold voltage corresponding to one of program states S1 and S2 respectively indicating logical values of "0" and "1". For example, the memory cells MC1 of the first memory cell array 121 may store presynaptic values, for example a1 to a4 of FIG. 3. Also, the memory cells MC1 of the first memory cell array 121 may store postsynaptic values, for example b1 to b3 of FIG. 3. A read voltage VREAD may be applied to the memory cell MC1 for the purpose of determining a program state of the memory cell MC1.

Referring to FIGS. 5 and 7, the second-type memory cell MC2 of the second memory cell array 122 may be an SLC or a multi-level cell (MLC) storing a plurality of bits. That is, in the case where the memory cell MC2 stores two bits, the memory cell MC2 may have a threshold voltage corresponding to one of program states S1, S2, S3, and S4 respectively indicating logical values of 00, 01, 10, and 11. For example, the memory cells MC2 of the second memory cell array 122 may store synaptic weight values, for example w11 to w43 of FIG. 3. Read voltage VREAD1 to VREAD3 may be applied to the memory cell MC2 for the purpose of determining a program state of the memory cell MC2.

Figure 8:
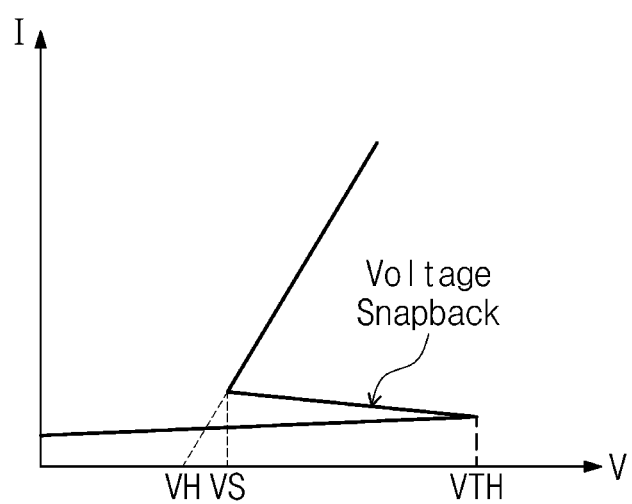
FIG. 8 is a graph illustrating an I-V characteristic of memory cells of FIG. 5 according to an embodiment.

FIG. 8 is a graph illustrating an I-V characteristic of memory cells of FIG. 5. A horizontal axis represents a voltage across a memory cell, and a vertical axis represents a current flowing through the memory cell.

A current flowing through a memory cell may be very small until the voltage across the memory cell reaches a threshold voltage VTH. When the voltage across the memory cell reaches the threshold voltage VTH of the memory cell, the memory cell may be turned on, and a voltage snapback may occur. The threshold voltage VTH may indicate a voltage at which the memory cell switches from a RESET state to a SET state. The memory cell may be turned off in the RESET state and may be turned on in the SET state. When the voltage snapback occurs, a current flowing through the memory cell may increase. The voltage across the memory cell may change from the threshold voltage VTH to a switching voltage VS. A voltage of a point at which a line extending from the I-V graph after the voltage snapback occurs and the horizontal axis cross each other may be a hold voltage VH. The read voltage VREAD, VREAD1, VREAD2, or VREAD3 may be applied to the memory cell having the threshold voltage VTH corresponding to any state, and data stored in the memory cell may be determined depending on a turn-on or turn-off of the memory cell.

Figure 9:
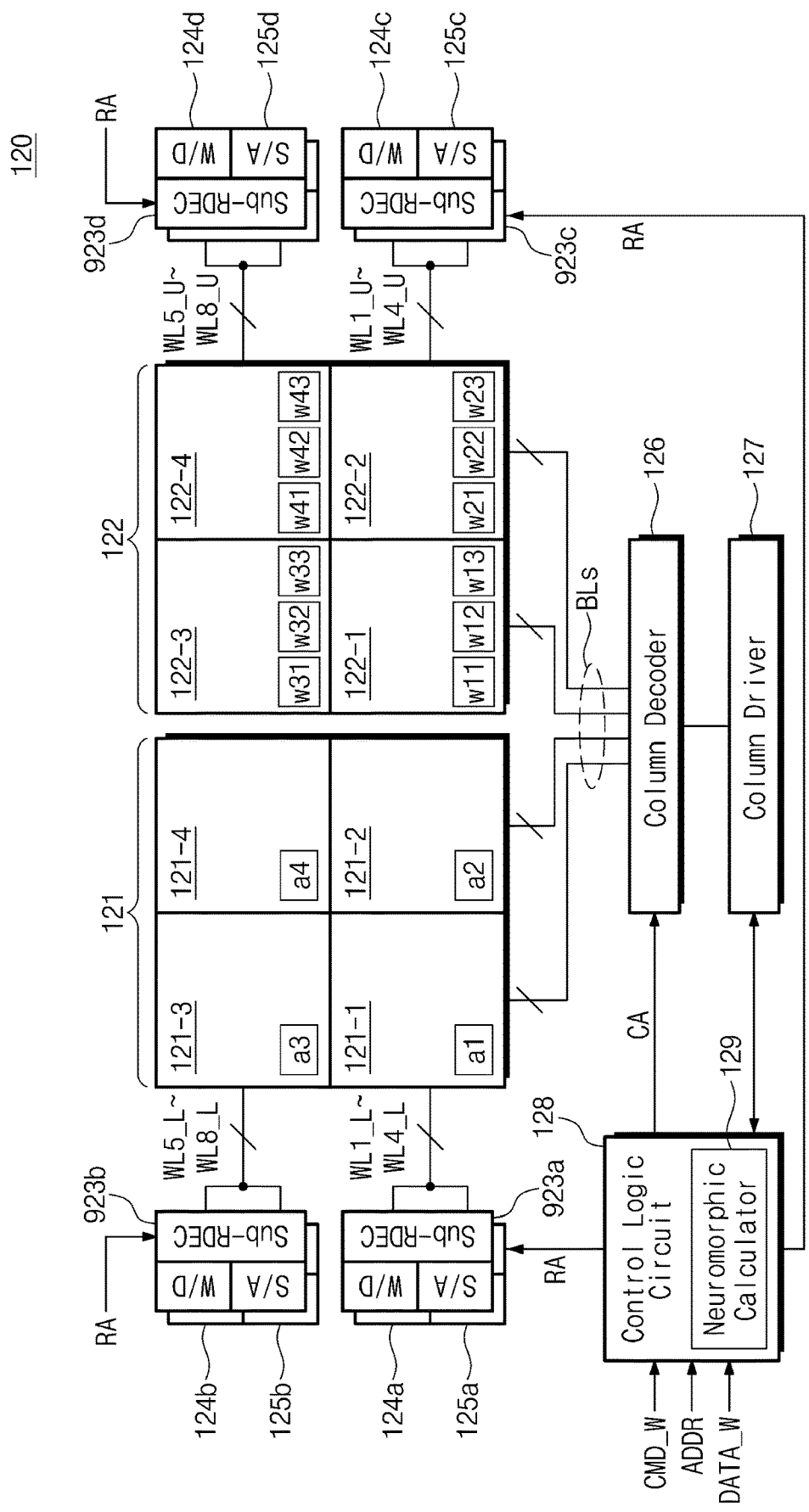
FIG. 9 illustrates a configuration of a memory device of FIG. 4 in detail, according to an embodiment.

FIG. 9 illustrates a configuration of a memory device of FIG. 4 in detail.

The memory device 120 may include the memory cell arrays 121 and 122, sub-row decoders 923a, 923b, 923c, and 923d, write drivers 124a, 124b, 124c, and 124d, sense amplifiers 125a, 125b, 125c, and 125d, the column decoder 126, the column driver 127, and the control logic circuit 128. Because the configuration of FIG. 9 is similar to the configuration of FIG. 4, a difference will be mainly described. For brevity of illustration, some of the components of FIG. 4 are briefly illustrated.

The memory cell array 121 may be divided into a plurality of tiles 121-1 to 122-4 including a plurality of memory cells, and the memory cell array 122 may be divided into a plurality of tiles 122-1 to 122-4 including a plurality of memory cells. A tile may be a set of memory cells sharing a row decoder and a sense amplifier. An example is illustrated in FIG. 9 as each tile includes 4×4 memory cells, but the disclosure is not limited thereto.

The memory cells of the tile 121-1 may be connected with one of the sub-row decoders 923a, one of the write drivers 124a, and one of the sense amplifiers 125a through the lower word lines WL1_L to WL4_L. For example, the tile 121-1 may correspond to the first synaptic memory 121-1, as shown for example in FIG. 2. The memory cells of the tile 122-1 may be connected with one of the sub-row decoders 923c, one of the write drivers 124c, and one of the sense amplifiers 125c through the upper word lines WL1_U to WL4_U. For example, the tile 122-1 may correspond to the first weight memory 122-1, as shown for example in FIG. 2. The remaining tiles 121-2 to 121-4 and 122-2 to 122-4 may be connected to be similar to the manner described above. In an embodiment, the number of tiles, the number of sense amplifiers, and the number of write drivers may be equal to each other.

According to this configuration, in the write operation, a number of parallel processing operations may be performed based on the number of tiles. For example, the memory device 120 may receive a write command CMD_W, the address ADDR, and write data DATA_W from the controller 110, as shown for example in FIG. 2, receiving a write request from the outside. The write data DATA_W may include the presynaptic values a1 to a4 and the weight values w11 to w43, and the control logic circuit 128 may decode the write command CMD_W to generate control signals necessary for the write operation and may decode the address ADDR to generate an address (RA, CA) associated with memory cells where the write data DATA_W are to be stored.

The control logic circuit 128 may store the presynaptic values a1 to a4 to different tiles of the first memory cell array 121, respectively. The control logic circuit 128 may group the weight values w11 to w43 and may store the grouped weight values to different tiles of the second memory cell array 122, respectively. For example, the weight values w11, w12, and w13 associated with the first presynaptic neuron A1, as shown for example in FIG. 3, from among the weight values w11 to w43 may be stored to the tile 122-1. As in the above description, the weight values w21, w22, and w23 associated with the second presynaptic neuron A2, as shown for example in FIG. 3, may be stored to the tile 122-2, and the remaining weight values w31 to w43 are also in a similar manner as described above.

In an embodiment as illustrated in FIG. 3, to output the first postsynaptic value b1, neuromorphic calculation between the presynaptic values a1 to a4 and weight values, for example w11, w21, w31, and w41, associated with the first postsynaptic value b1 is necessary. In an embodiment, because the neuromorphic calculation illustrated in FIG. 3 is composed of a sum of a plurality of multiplication operations, the plurality of multiplication operations may be processed in parallel for the purpose of improving the speed of the neuromorphic calculation. To this end, the presynaptic values a1 to a4 and the weight values w11 to w43 may be distributed and stored into tiles. The embodiment illustrated in FIG. 9 is an example of such a tile-based implementation. In the case where the number of tiles of the second memory cell array 122 is equal to or more than the number of weight values w11 to w43, the weight values w11 to w43 may be stored in different tiles of the second memory cell array 122.

Figure 10:
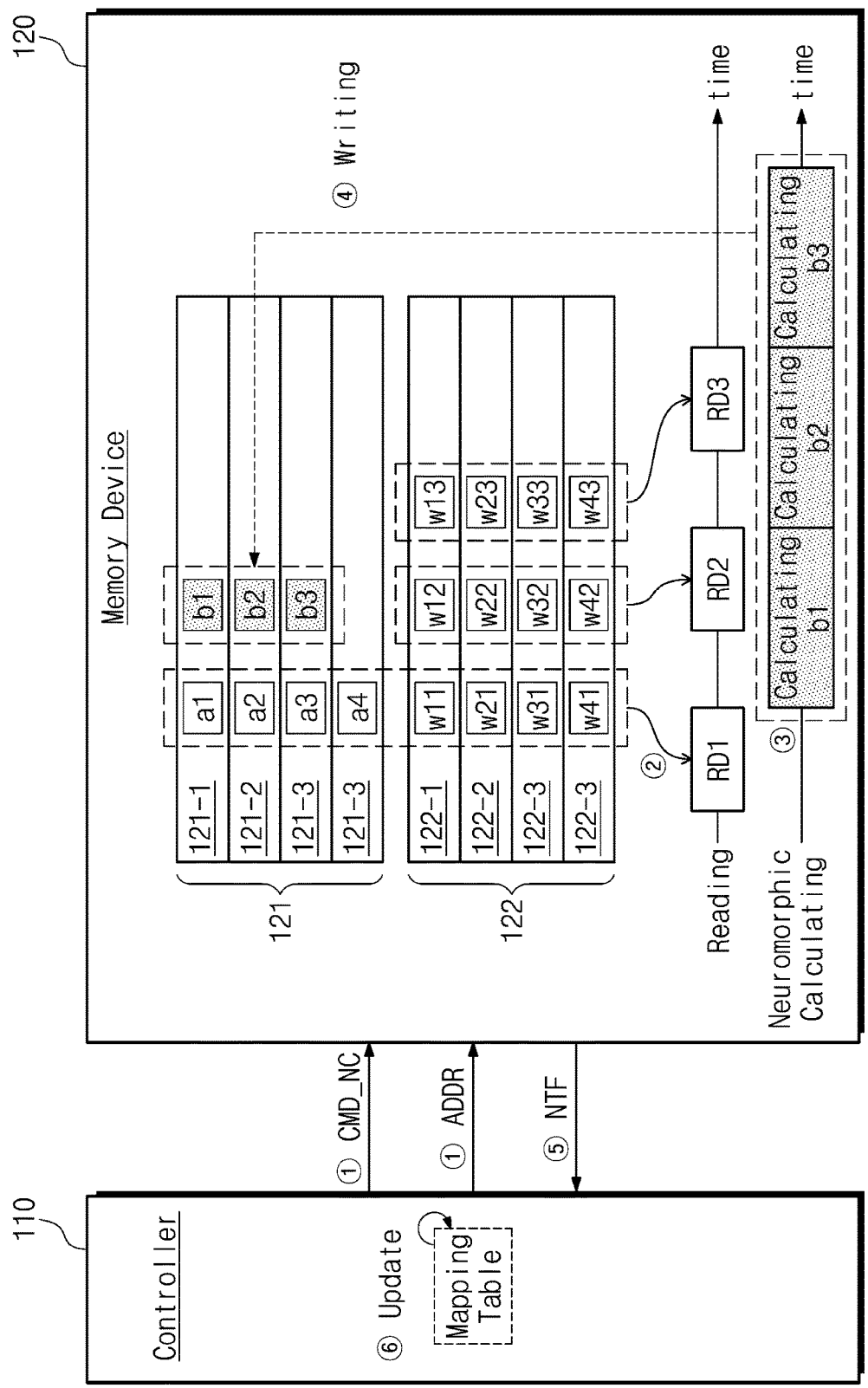
FIG. 10 conceptually illustrates how to process neuromorphic calculation in parallel, according to an embodiment.

FIG. 10 conceptually illustrates how to process neuromorphic calculation in parallel, according to an embodiment.

Referring to FIGS. 3, 9, and 10 together, the controller 110 may generate a neuromorphic command CMD_NC and an address ADDR_R necessary to perform the neuromorphic calculation depending on a request from the outside at operation ①. For example, the address ADDR_R may include a memory address at which the presynaptic values a1 to a4 are stored, a memory address at which the weight values w11 to w43 are stored, and a memory address at which the postsynaptic values b1, b2, and b3 to be generated as a result of the neuromorphic calculation are to be stored.

The control logic circuit 128 may decode the address ADDR_R and may generate row addresses and column addresses at which the presynaptic values a1 to a4 and the weight values w11 to w43 are stored. The control logic circuit 128 may decode the neuromorphic command CMD_NC and may generate a read-related command, a neuromorphic calculation-related command, and a command associated with storing postsynaptic values. Based on the decoded addresses and the decoded commands, the presynaptic values a1 to a4 and the weight values w11, w21, w31, and w41 may be read from the memory cell arrays 121 and 122 at operation ②. As described with reference to FIG. 9, because the presynaptic values a1 to a4 are stored in different tiles of the first memory cell array 121 and the weight values w11, w21, w31, and w41 are stored in different tiles of the second memory cell array 122, read operations may be performed in parallel.

The read presynaptic values a1 to a4 and the read weight values w11, w21, w31, and w41 may be converted to be appropriate for the neuromorphic calculation, for example into a digital value, and the converted values may be stored in the control logic circuit 128. The neuromorphic calculator 129 may calculate the first postsynaptic value b1 depending on the decoded command associated with the neuromorphic calculation. After the presynaptic values a1 to a4 are read, the weight values w12, w22, w32, and w42 may be read from the second memory cell array 122. The neuromorphic calculator 129 may calculate the second postsynaptic value b2 by using the postsynaptic values a1 to a4 and the weight values w12, w22, w32, and w42, which are appropriately processed. After the weight values w12, w22, w32, and w42 are read, the weight values w13, w23, w33, and w43 may be read from the second memory cell array 122. The neuromorphic calculator 129 may calculate the third postsynaptic value b3 by using the postsynaptic values a1 to a4 and the weight values w13, w22, w33, and w43, which are appropriately processed. Finally, the neuromorphic calculator 129 may perform a sum operation on the postsynaptic values b1 to b3 at operation ③.

The control logic circuit 128 may store the postsynaptic values b1 to b3 to memory cells of the first memory cell array 121, which the decoded address indicates at operation ④. The postsynaptic values b1 to b3 may be stored to different tiles of the first memory cell array 121, respectively. The memory device 120 may transfer a signal NTF, which provides notification that the neuromorphic calculation is completed and the postsynaptic values b1 to b3 are stored to the first memory cell array 121, to the controller 110. The controller 110 may update a mapping table associated with logical addresses and physical addresses of the postsynaptic values b1 to b3 in response to the signal NFT at operation ⑥. For example, the mapping table may be managed by a flash translation layer.

Figure 11:
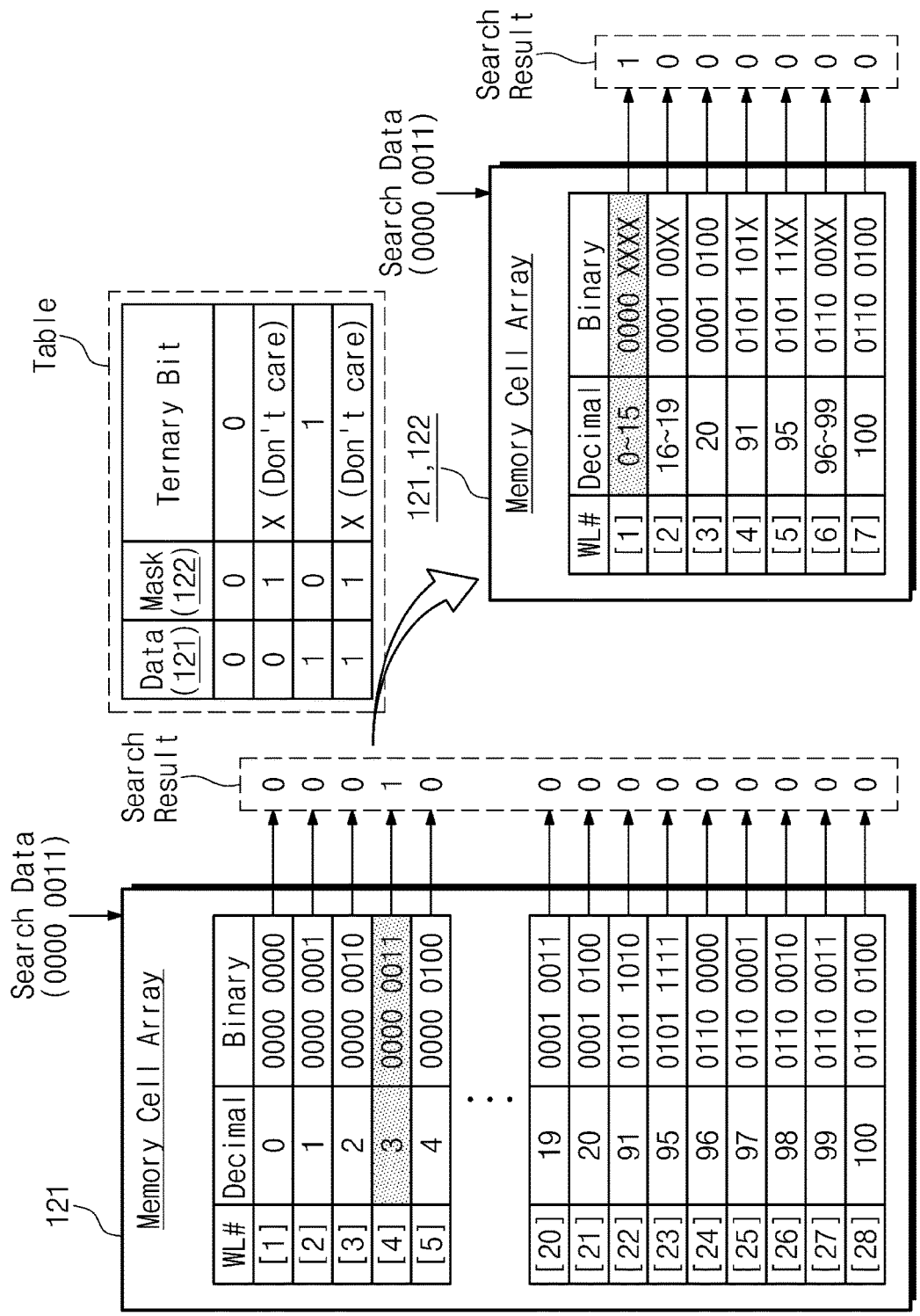
FIG. 11 conceptually illustrates compression of binary data to ternary data, according to an embodiment.

FIG. 11 conceptually illustrates compression of binary data to ternary data, according to an embodiment of the present disclosure. Conversion to ternary data may be used to facilitate search for data stored in a memory cell array. It is assumed that each of binary data and ternary data is composed of 8 bits. The conversion to the ternary data is described with reference to FIGS. 5 and 11 together.

First, a range of binary data to be compressed may be selected. In an embodiment, binary data "0000 0000" to "0000 1111" corresponding to decimal data "0" to "15" may be compressed to ternary data.

Depending on whether bits of specific positions of a bit string of binary data includes "0", "1", or "0" and "1", the bits of the specific positions of the binary data may be converted into a ternary bit "0", "1", or "X". For example, least significant bits (LSBs) of the binary data "0000 0000" to "0000 1111" include "0" or "1". Therefore, the LSBs of the binary data "0000 0000" to "0000 1111" may be converted into the ternary bit "X". Because fifth significant bits (5SBs) to most significant bits (MSBs) of the binary data "0000 0000" to "0000 1111" include "0", the 5SBs to MSBs may be converted into the ternary bit "0". In this manner, the binary data "000000" to "0000 1111" may be converted into ternary data "0000 XXXX".

In an embodiment, binary data "0001 0000" to "0001 0011" corresponding to decimal data "16" to "19" may be compressed to ternary data. Because LSBs and second significant bits (2SBs) of the binary data "0001 0000" to "0001 0011" include "0" or "1", the LSBs and 2SBs may be converted into "X". Because third significant bits (3SBs), 4SBs, and 6SBs to MSBs of the binary data "0001 0000" to "0001 0011" include "0", the 3SBs, 4SBs, and 6SBs to MSBs may be converted into the ternary bit "0". Because the 5SBs of the binary data "0001 0000" to "0001 0011" include "1", the 5SBs may be converted into the ternary bit "1". According to the above manner, the decimal data "16" to "19" may be converted into ternary data "0001 00XX".

Other binary data may be converted into ternary data depending on the given table.

The ternary bit "0" may correspond to bit "0" stored in the first memory cell array 121 and bit "0" stored in the second memory cell array 122. Accordingly, bit "0" may be stored in each of a lower memory cell, for example MC1 of FIG. 5, and an upper memory cell, for example MC2 of FIG. 5, connected in common with one bit line BL1. For example, bit "0" may correspond to a high resistance state, and bit "1" may correspond to a low resistance state.

The ternary bit "1" may correspond to bit "1" stored in the first memory cell array 121 and bit "0" stored in the second memory cell array 122. Accordingly, bit "1" and bit "0" may be respectively stored in the lower memory cell MC1 and the upper memory cell MC2 connected in common with one bit line BL1.

The ternary bit "X" may correspond to bit "0" or bit "1" stored in the first memory cell array 121 and bit "1" stored in the second memory cell array 122. Accordingly, bit "0" or "1" and bit "1" may be respectively stored in the lower memory cell MC1 and the upper memory cell MC2 connected in common with one bit line BL1.

In an embodiment, a value stored in the first memory cell array 121 may be referred to as a "data bit", and a value stored in the second memory cell array 122 may be referred to as a "mask bit".

In the case where decimal data 1 to 15, 16 to 19, 20, 91, 95, 96 to 99, and 100 are converted and stored into binary data, each of 28 word lines requires an 8-bit storage space. In the case where decimal data 1 to 15, 16 to 19, 20, 91, 95, 96 to 99, and 100 are converted and stored into ternary data, each of 7 upper word lines and 7 lower word lines requires an 8-bit storage space. Therefore, the conversion to ternary data may be used to store data for searching for a specific value.

Figure 12:
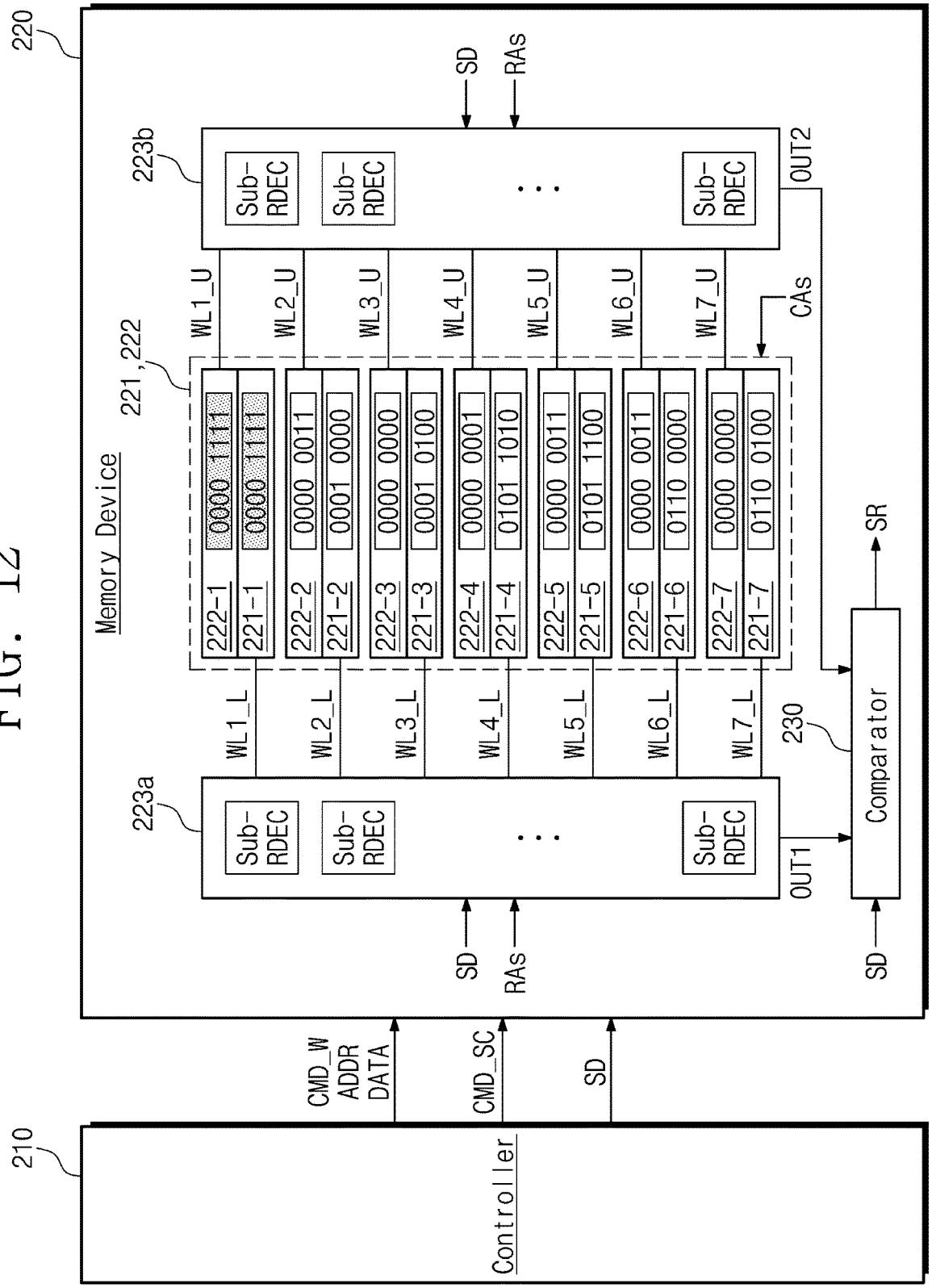
FIG. 12 illustrates a memory device searching for data stored in the form of ternary data, according to an embodiment.

FIG. 12 illustrates a memory device for searching data stored in the form of ternary data, according to an embodiment of the present disclosure.

A memory device 220 includes memory cell arrays 221 and 222, row decoders 223a and 223b, and a comparator 230. The memory cell arrays 221 and 222 may correspond to the memory cell arrays 121 and 122 of FIG. 9, respectively. Sub-row decoders Sub-RDEC included in the row decoder 223a correspond to the sub-row decoders 923a and 923b of FIG. 9, and sub-row decoders included in the row decoder 223b correspond to the sub-row decoders 923c and 923d of FIG. 9.

A controller 210 may convert binary data into ternary data based on the table of FIG. 11. The controller 210 may transfer the write command CMD_W, the address ADDR_R, and ternary data DATA. For example, a control logic circuit corresponding to the control logic circuit 128 illustrated in FIG. 4 may decode the address ADDR_R to generate column addresses CAs and row addresses RAs. For example, write drivers corresponding to the write drivers 124a and 124b illustrated in FIG. 4 may store the ternary data DATA in an area of the memory cell arrays 221 and 222, which the addresses CAs and RAs indicate.

The controller 210 may transmit a search command CMD_SC to the memory device 220. The search command CMD_SC may be associated with a command for searching for specific data of the memory cell arrays 221 and 222, in which ternary data are stored, based on the table of FIG. 11. The controller 210 may transmit search data SD to the memory device 220. In an embodiment, the search data SD may be "0000 0011" of FIG. 11.

The control logic circuit of the memory device 220 may decode the search command CMD_SC and may generate commands and addresses for searching for the specific data stored in the memory cell arrays 221 and 222. For example, the decoded command may include a read command for all memory cells targeted for search. For example, the decoded addresses may include the row addresses RAs and the column addresses CAs for all the memory cells targeted for search. As switches of the row decoders 223a and 223b are closed depending on the row addresses RAs, sense amplifiers may be electrically connected with word lines, for example WL1_L to WL7_L and WL1_U to WL7_U, connected with the memory cells targeted for search.

The search data SD may be input to the respective word lines, for example WL1_L to WL7_L and WL1_U to WL7_U. As the search data SD are input to memory cells programmed with specific bits, different data may be output depending on whether the search data SD and the specific bits coincide.

For example, the search data SD may be input to the first lower word line WL1_L to which memory cells are connected. Bits "0000 0011" of the search data SD may be respectively input to 8 memory cells where "0000 1111" are stored. Because bit "0" corresponds to a high resistance state and bit "1" corresponds to a low resistance state, when "0000 0011" is respectively input to the 8 memory cells where "00001111" is stored, "0000 0011" may be output from the memory cells. Also, the search data SD may be input to the first upper word line WL1_U. Similarly, "0000 0011" may be output from memory cells connected with the first upper word line WL1_U. As a result, it may be determined that search data are stored in memory cells of the first lower word line WL1_L and the first upper word line WL1_U in a ternary form.

The comparator 230 may output a search result SR based on an output OUT1 from the memory cells of the first memory cell array 221 and the memory cells of the second memory cell array 222. The comparator 230 may compare the search data SD with the output OUT1 and/or OUT2 from the memory cells; depending on whether the search data SD and the output OUT1 and/or OUT2 coincide, the comparator 230 may output a bit, for example "1", indicating that data matched with the search data SD are stored in memory cells. For example, the comparator 230 may be implemented with various components, for example logic elements and multiplexers, configured to compare the search data SD with the output OUT1 and/or OUT2 from the memory cells.

In another example, the search data SD may be input to memory cells connected with the third lower word line WL3_L. When the bits "0000 0011" of the search data SD are respectively input to 8 memory cells where "00010100" is stored, "0000 0000" may be output from the memory cells. Also, the search data SD are input to the third upper word line WL3_U. When the bits "0000 0011" of the search data SD are respectively input to 8 memory cells where "0000 0000" is stored, "000 0000" may be output from the memory cells. That is, it may be determined that the search data are not stored in memory cells of the third lower word line WL3_L and the third upper word line WL3_U.

In an embodiment, a read operation of the first memory cell array 221 and a read operation of the second memory cell array 222 may be performed at the same time or may be performed at different times.

Figure 13:
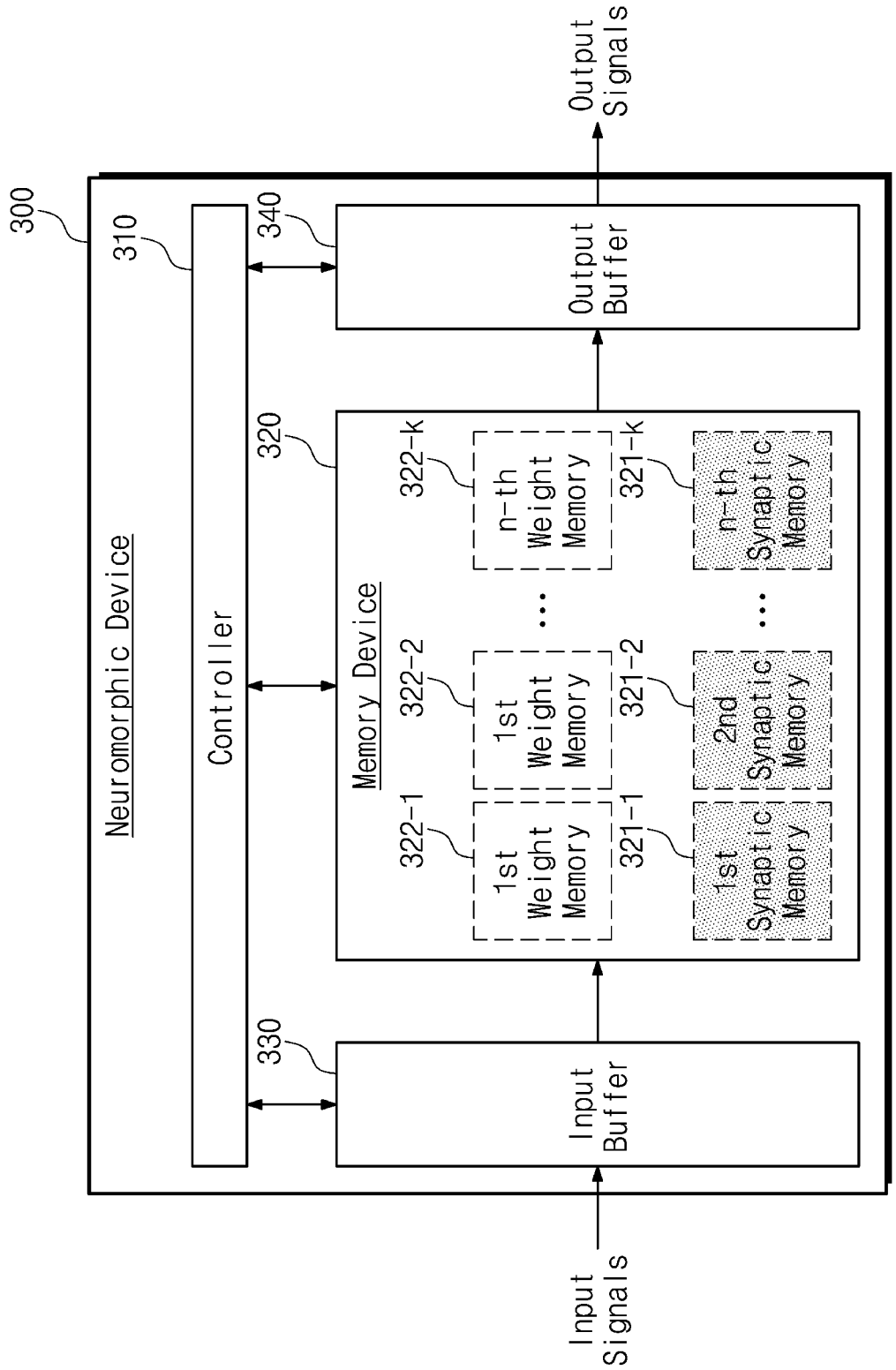
FIG. 13 illustrates an exemplary configuration of a neuromorphic device according to an embodiment.

FIG. 13 illustrates an exemplary configuration of a neuromorphic device of the present disclosure. A neuromorphic device 300 may include a controller 310, a memory device 320, an input buffer 330, and an output buffer 340. The controller 310 may correspond to the controller 110 of FIG. 2, 10, or 12, and the memory device 320 may correspond to the memory device 120 of FIG. 2, 10, or 12, and the input buffer 330 and the output buffer 340 may correspond to the buffer 130 of FIG. 2, 10, or 12. Configurations and operations of the controller 310 and the memory device 320 may be similar to the configurations and operations of a controller and a memory device described with reference to the above embodiments. Thus, additional description will be omitted to avoid redundancy.

However, the input buffer 330 may be dedicated for an input. For example, the input buffer 330 may receive signals, which correspond to spikes which are output from presynaptic neurons, from the outside. In an embodiment, when weight values are not calculated in a neuromorphic device and are received from the outside, the input buffer 330 may receive weight values from the outside. Under control of the controller 310, signals buffered by the input buffer 330 may be stored to synaptic memories 321-1 to 321-$k$ of the memory device 320, and weight values may be calculated based on the buffered signals. The calculated weight values may be stored to weight memories 322-1 to 322-$k$ of the memory device 320.

The output buffer 340 may buffer a result of neuromorphic calculation performed by the controller 310 or the memory device 320. The output buffer 340 may provide the buffered result of the neuromorphic calculation to a user.

In another embodiment, the result of the neuromorphic calculation buffered by the output buffer 340 may be used to obtain a result of another neuromorphic calculation. In other words, the result of the neuromorphic calculation buffered by the output buffer 340 may correspond to spikes which are output from postsynaptic neurons. However, based on new neuromorphic calculation being performed on other postsynaptic neurons following the postsynaptic neurons, the result of the neuromorphic calculation buffered by the output buffer 340 may correspond to spikes which are output from presynaptic neurons. In this case, the result of the neuromorphic calculation buffered by the output buffer 340 may be transmitted to the input buffer 330 and may be used for another neuromorphic calculation.

Figure 14:
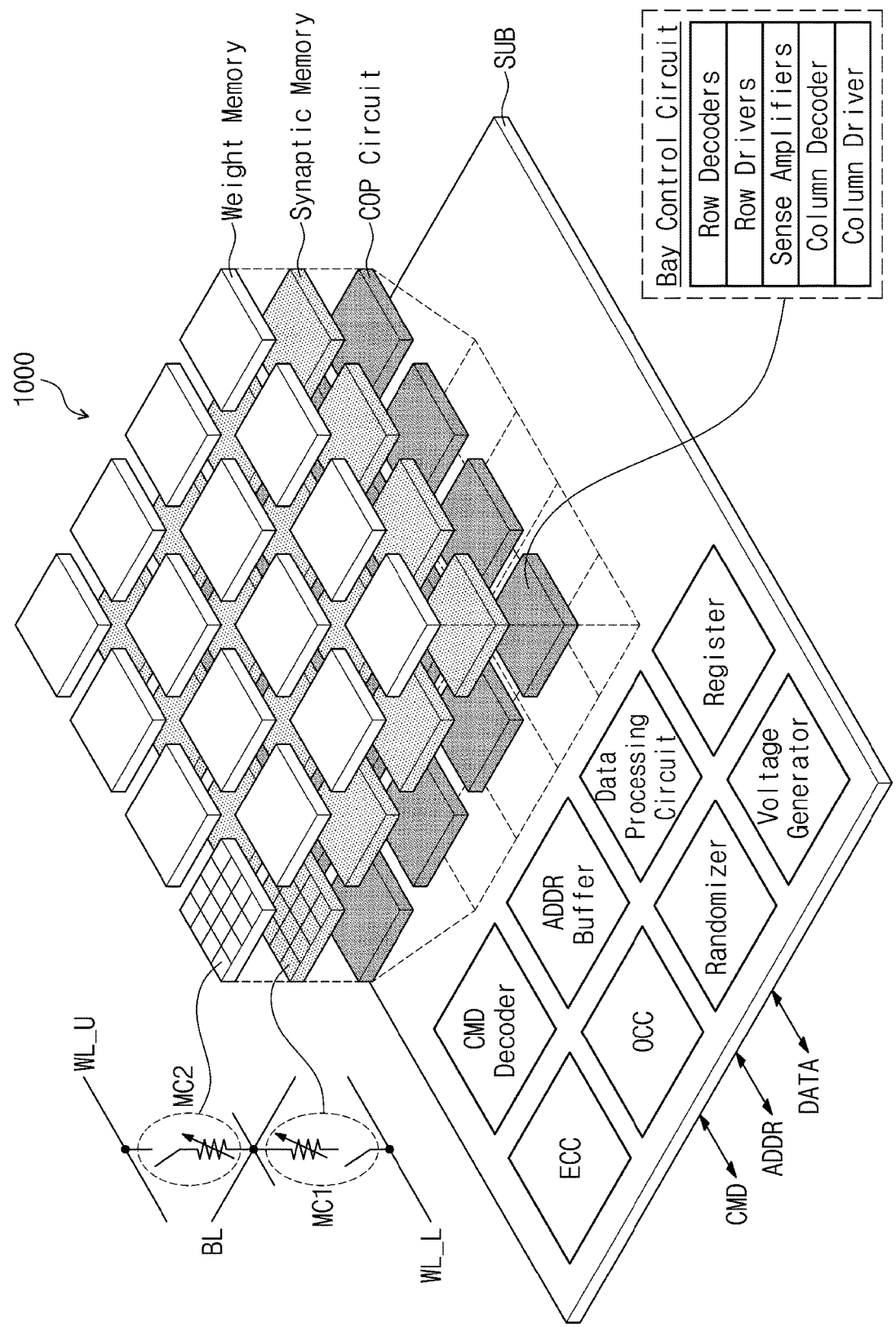
FIG. 14 illustrates an exemplary configuration of a memory device according to an embodiment.

FIG. 14 illustrates an exemplary configuration of a memory device. A memory device 1000 may correspond to the memory devices 120, 220, and 320 described in the above embodiments. The memory device 1000 may include a core on peripheral (COP) circuit, synaptic memories, and weight memories formed on a substrate SUB. The memory device 1000 may further include peripheral circuits which are not a COP circuit.

COP circuits may be formed on the substrate SUB. The synaptic memories may be formed on the COP circuits. The weight memories may be formed on the synaptic memories. A ratio of the number of COP circuits, the number of synaptic memories, and the number of weight memories may be 1:1:1. One synaptic memory may correspond to one tile included in a first memory cell array, for example 121 of FIG. 9 or 221 of FIG. 12, and one weight memory may correspond to one tile included in a second memory cell array, for example 122 of FIG. 9 or 222 of FIG. 12.

The COP circuit may include a bay control circuit. For example, the bay control circuit may include row decoders, row drivers, sense amplifiers, a column decoder, and a column driver. For example, the row decoders may include at least two row decoders for controlling at least one synaptic memory and at least one weight memory. For example, the write drivers may include a write driver for driving word lines connected with at least one synaptic memory and a write driver for driving word lines connected with at least one weight memory. The sense amplifiers may include a sense amplifier for amplifying a voltage of a sensing data line associated with a synaptic memory and a sense amplifier for amplifying a voltage of a sensing data line associated with a weight memory.

However, in another embodiment, at least a part of the above bay control circuits may not be a COP circuit and may be implemented with a peripheral circuit disposed in the vicinity of a synaptic memory or a weight memory.

The memory device 1000 may further include a command (CMD) decoder, an address (ADDR) buffer, a data processing circuit, an error correction circuit (ECC), an on cell counter (OCC), a randomizer, registers, and a voltage generator. The above components may be implemented in a peripheral circuit of the memory device 1000. However, in another embodiment, the components may be implemented with COP circuits.

The command decoder may receive the command CMD from the outside, for example a host or a memory controller, of the memory device 1000. The command decoder may decode the command CMD for controlling the components of the memory device 1000. For example, the command CMD may include a read command for the memory cells MC1 and MC2. To perform a read/write operation of the memory cells MC1 and MC2, a decoded command may be provided to relevant bay control circuits.

The address buffer may receive the address ADDR from the outside, for example a memory controller, of the memory device 1000. The address ADDR may indicate one or more memory cells to be selected from among memory cells of the memory device 1000. The address buffer may provide a column address to a bay control circuit including a column decoder connected with a memory cell indicated by the address ADDR. The address buffer may provide a row address to the bay control circuit including a row decoder connected with the memory cell indicated by the address ADDR.

The data processing circuit may receive the data DATA from outside of the memory device 1000. For example, the data DATA may be signals and/or weight values corresponding to spikes which are output from presynaptic neurons. The data processing circuit may provide data to a bay control circuit. As the data processing circuit controls the bay control circuit based on the command CMD and the address ADDR, values of signals corresponding to spikes which are output from presynaptic neurons may be stored to the synaptic memories. As the data processing circuit controls the bay control circuit, weight values may be stored to the weight memories. The data processing circuit may read data stored in the synaptic memories and/or the weight memories based on the command CMD and the address ADDR.

The error correction circuit may encode data to be stored to the selected memory cells MC1 and MC2 based on an error correction code. The error correction circuit may decode data read from the memory cells MC1 and MC2 based on the error correction code. The error correction circuit may detect an error of the read data, may calculate an error count, for example the number of error (or fail) bits, of the read data, may determine whether the error of the read data is correctable, or may correct the error of the read data. The error correction circuit may provide the error count of the read data to the data processing circuit. For example, the data processing circuit may provide write data encoded by the error correction circuit to a selected bay control circuit. The data processing circuit may output the data DATA including read data decoded by the error correction circuit.

The on cell counter may calculate the number OCC of turned-on memory cells of the memory cells MC1 and MC2 based on the read data output from the memory cells MC1 and MC2. The on cell counter may provide the number OCC of turned-on memory cells to the data processing circuit. The on cell counter may be provided outside the memory device 1000.

The randomizer may randomize data to be stored to the memory cells MC1 and MC2. The randomizer may de-randomize data read from the memory cells MC1 and MC2. For example, when a memory cell stores one of digital logical values of "0" and "1", the randomizer may adjust a ratio of 1s to 0s of write data to be written to the memory cells MC1 and MC2. The randomizer may calculate a ratio of 1s to 0s of read data. For example, the randomizer may determine whether the ratio of 1s to 0s of the write data and the ratio of 1s to 0s of the read data are different. The randomizer may provide the above ratio information to the data processing circuit. The randomizer may be provided outside the memory device 1000.

The registers may store various information about the memory device 1000. For example, the registers may store the following information: a result of an operation performed by the error correction circuit, an error count calculated by the error correction circuit, the number OCC of turned-on memory cells calculated by the on cell counter, a ratio calculated by the randomizer, write data, read data, and an operating condition.

The voltage generator may generate various voltages to be used in the memory device 1000 by using a power supply voltage supplied to the memory device 1000, and may provide the generated voltages to the components of the memory device 1000. The power supply voltage supplied to the memory device 1000 may include VDD, VPP, GND, etc. The voltage generator may generate and provide various voltages, for example V1 and V2 described with reference to FIG. 4. Also, the voltages used in the memory device 1000 may include an non-selection bit line voltage to be applied to an unselected bit line, a non-selection word line voltage to be applied to an unselected word line, a program bit line voltage, a program word line voltage, a reference voltage to be used by a sense amplifiers, etc.

Figure 15:
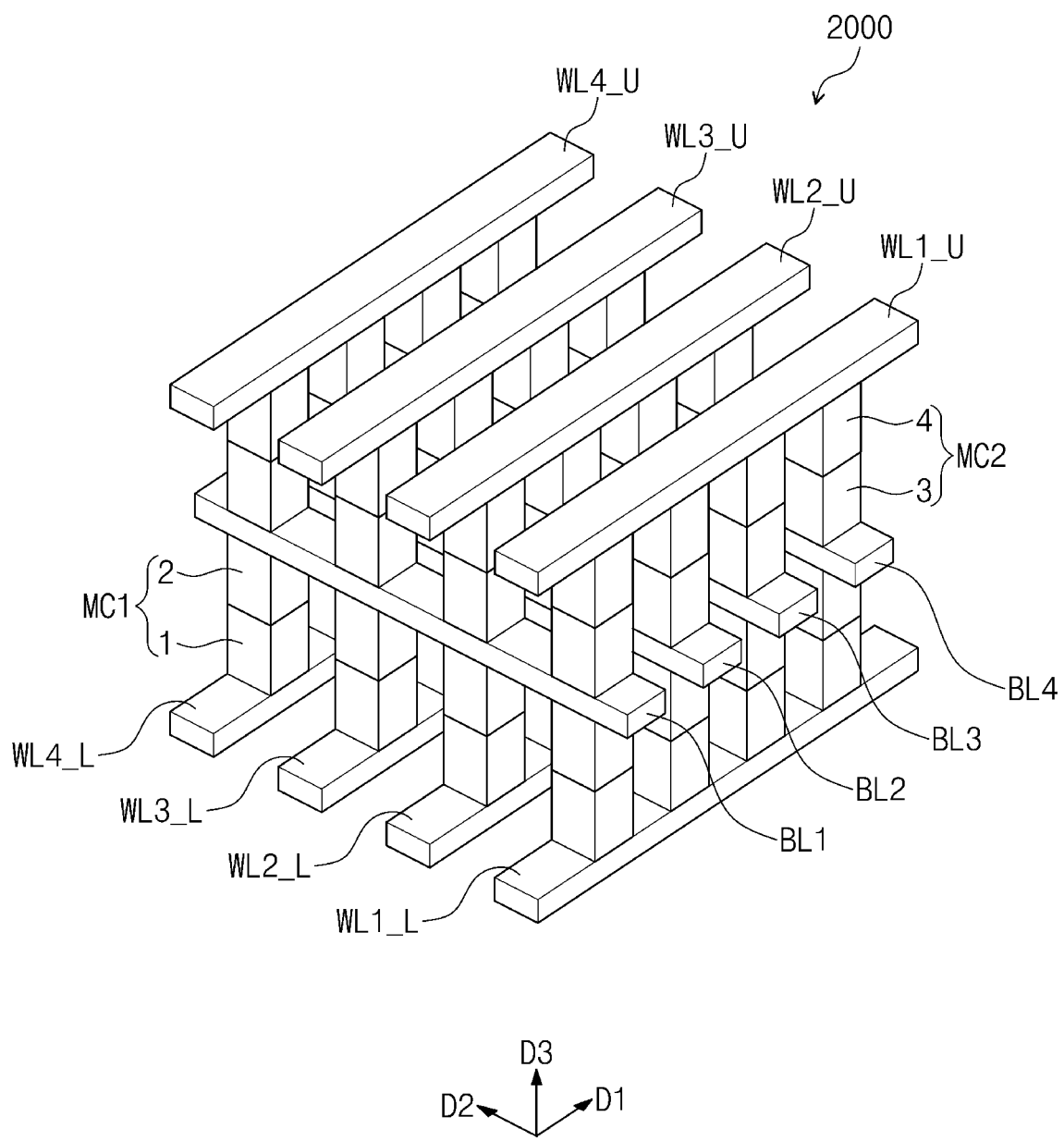
FIG. 15 illustrates a three-dimensional structure of an exemplary volatile memory device according to an embodiment.

FIG. 15 illustrates a three-dimensional structure of an exemplary volatile memory device of the present disclosure. A volatile memory device 2000 includes a plurality of memory cells MC. Each of the memory cells MC1 may include the switching element 1 and the resistive element 2 as described with reference to FIG. 5. Each of the memory cells MC2 may include the switching element 3 and the resistive element 4 as described with reference to FIG. 5.

The memory cells MC1 may be formed between the lower word lines WL1_L to WL4_L extending in the first direction D1 and the bit lines BL1 to BL4 extending in the second direction D2 intersecting the first direction D. The switching elements 1 may be formed on the lower word lines WL1_L to WL4_L in a third direction D3 perpendicular to the first direction D1 and the second direction D2, and the resistive elements 2 may be formed on the switching elements 1 in the third direction D3. The bit lines BL1 to BL4 may be formed on the resistive elements 2 along the second direction D2.

The memory cells MC2 may be formed between the upper word lines WL1_U to WL4_U extending in the first direction D1 and the bit lines BL1 to BL4 extending in the second direction D2. The switching elements 3 may be formed on the bit lines BL1 to BL4 in the third direction D3, and the resistive elements 4 may be formed on the switching elements 3 in the third direction D3. The upper word lines WL1_U to WL4_U may be formed on the resistive elements 4 along the first direction D1.

The memory cells MC1 may be formed at a first floor between the lower word lines WL1_L to WL4_L and the bit lines BL1 to BL4, and the memory cells MC2 may be formed at a second floor between the bit lines BL1 to BL4 and the upper word lines WL1_U to WL4_U. Memory cells connected with the lower word lines WL1_L to WL4_L and memory cells connected with the upper word lines WL1_U to WL4_U may be connected with different write drivers and different sense amplifiers.

In an embodiment, the memory cell MC1 may be programmed by using a write driver connected with the lower word line WL1_L and a voltage applied to the bit line BL1. Data stored in the memory cell MC1 may be read by using a sense driver connected with the lower word line WL1_L and a voltage applied to the bit line BL1. As in the above description, the memory cell MC2 may be programmed by using a write driver connected with the upper word line WL1_U and a voltage applied to the bit line BL1. Data stored in the memory cell MC2 may be read by using a sense driver connected with the upper word line WL1_U and a voltage applied to the bit line BL.

According to embodiments of the present disclosure, there may be provided a structure of a three-dimensional neuromorphic device using a phase change element and an ovonic threshold switch.

In addition, according to the embodiments of the present disclosure, data may be efficiently stored in the three-dimensional neuromorphic device.

While the disclosure has been described with reference to exemplary embodiments thereof, it will be apparent to those of ordinary skill in the art that various changes and modifications may be made thereto without departing from the spirit and scope as set forth in the following claims.

What is claimed is:

1. A neuromorphic device comprising:
a controller configured to generate ternary data by converting each bit of binary data into a ternary bit; and
a memory device configured to store the ternary data, wherein the memory device includes:
a first memory cell array including first memory cells formed between lower word lines and bit lines, wherein a first memory cell of the first memory cells includes a first switching element and a first resistive element;
a second memory cell array including second memory cells formed between upper word lines and the bit lines, wherein a second memory cell of the second memory cells includes a second switching element and a second resistive element;
a first row decoder configured to select a row of the first memory cell array; and
a second row decoder configured to select a row of the second memory cell array, and
wherein each bit of the ternary data is identified by a combination of a data bit stored in the first memory cells and a mask bit stored in the second memory cells,
wherein based on receiving a search command from the controller, the first row decoder is configured to select first word lines connected with memory cells from among the first memory cell array in which the ternary data are stored, and
wherein based on receiving the search command from the controller, the second row decoder is configured to select second word lines connected with memory cells from among the second memory cell array in which the ternary data are stored.

2. The neuromorphic device of claim 1, further comprising:
a first write driver configured to provide a voltage corresponding to search data specified by the search command to the first memory cell array through the first word lines; and
a second write driver configured to provide the voltage corresponding to the search data to the second memory cell array through the second word lines.

3. The neuromorphic device of claim 2, further comprising:
a first sense amplifier configured to sense a voltage output from the first memory cell array based on the voltage corresponding to the search data being provided; and
a second sense amplifier configured to sense a voltage output from the second memory cell array based on the voltage corresponding to the search data being provided.

4. The neuromorphic device of claim 3, further comprising:
a comparator configured to compare the search data with an amplification result of the first sense amplifier or an amplification result of the second sense amplifier, and to determine whether the search data are stored in the first memory cell array and the second memory cell array, based on a result of the comparison.

5. The neuromorphic device of claim 3, wherein a first core on peripheral (COP) circuit includes the first row decoder, the first write driver, and the first sense amplifier, and
wherein a second COP circuit includes the second row decoder, the second write driver, and the second sense amplifier.

6. The neuromorphic device of claim 5, wherein the first memory cell array is disposed on the first COP circuit and the second COP circuit, and
wherein the second memory cell array is disposed on the first memory cell array.

7. The neuromorphic device of claim 1, wherein at least one from among the first switching element and the second switching element includes an ovonic threshold switch, and
wherein at least one from among the first resistive element and the second resistive element includes a phase change element.

8. A neuromorphic device comprising:
a controller configured to receive presynaptic values corresponding to output signals of presynaptic neurons from outside of the neuromorphic device and to calculate weight values based on the presynaptic values; and
a memory device including a first memory cell array and a second memory cell array,
wherein the first memory cell array includes first memory cells formed between lower word lines and bit lines, and wherein a first memory cell of the first memory cells includes a first switching element and a first resistive element,
wherein the second memory cell array includes second memory cells formed between the bit lines and upper word lines, and wherein a second memory cell of the second memory cells includes a second switching element and a second resistive element,
wherein the first memory cell corresponds to the second memory cell, wherein the first memory cell and the second memory cell are connected in common with a same bit line of the bit lines, and wherein the presynaptic values are stored to the first memory cell array, and the weight values are stored to the second memory cell array.

9. The neuromorphic device of claim 8, wherein the memory device further includes:

a plurality of sub-row decoders, a plurality of write drivers, and a plurality of sense amplifiers, wherein the first memory cell array is divided into a first plurality of tiles, wherein the second memory cell array is divided into a second plurality of tiles, and wherein each first tile of the first plurality of tiles of the first memory cell array and each second tile of the second plurality of tiles of the second memory cell array are connected with different sub-row decoders, different write drivers, and different sense amplifiers.

10. The neuromorphic device of claim 9, wherein the presynaptic values are stored to respective tiles of the first plurality of tiles, and wherein the weight values associated with postsynaptic values generated based on the presynaptic values are stored in respective tiles of the second plurality of tiles.

11. The neuromorphic device of claim 10, wherein the memory device further includes a control logic circuit configured to perform neuromorphic calculation based on matrix multiplication of the presynaptic values and the weight values.

12. The neuromorphic device of claim 11, wherein the control logic circuit is further configured to:

simultaneously read the presynaptic values stored in the first plurality of tiles based on a command and an address received from the controller, and simultaneously read the weight values associated with the postsynaptic values stored in the second plurality of tiles based on the command and the address received from the controller.

13. The neuromorphic device of claim 12, wherein the control logic circuit is further configured to perform a multiplication operation on the presynaptic values and the weight values corresponding to the presynaptic values and to perform an add operation on results of the multiplication operation.

14. The neuromorphic device of claim 13, wherein the control logic circuit is further configured to store the postsynaptic values resulting from the add operation to the first memory cell array.

15. The neuromorphic device of claim 14, wherein the controller is further configured to update a mapping table defining a relationship between a physical address and a logical address associated with memory cells in which the postsynaptic values are stored.

16. A memory device for neuromorphic calculation, comprising:

a first plurality of tiles including a first plurality of memory cells;

a second plurality of tiles formed on the first plurality of tiles and including a second plurality of memory cells;

first write drivers respectively corresponding to the first plurality of tiles;

first sense amplifiers respectively corresponding to the first plurality of tiles;

second write drivers respectively corresponding to the second plurality of tiles; and second sense amplifiers respectively corresponding to the second plurality of tiles, wherein the first plurality of memory cells are formed between lower word lines and bit lines and the second plurality of memory cells are formed between the bit lines and upper word lines, wherein each of the first plurality of memory cells and the second plurality of memory cells includes a switching element and a resistive element, and wherein presynaptic values corresponding to output signals of presynaptic neurons are stored to the first plurality of memory cells and weight values based on the presynaptic values are stored to the second plurality of memory cells.

17. The memory device of claim 16, wherein the switching element includes an ovonic threshold switch, and the resistive element includes a phase change element.

18. The memory device of claim 16, wherein each of the first plurality of memory cells comprises a single level cell (SLC) configured to store one bit, and wherein each of the second plurality of memory cells comprises a multi-level cell (MLC) configured to store a plurality of bits.

19. The neuromorphic device of claim 1, wherein a first ternary value of the each ternary bit is represented by a first binary value being stored in the data bit and a second binary value being stored in the mask bit, wherein a second ternary value of the each ternary bit is represented by the second binary value being stored in the data bit and the second binary value being stored in the mask bit, and wherein a third ternary value of the each ternary bit is represented by one of the first binary value or the second binary value being stored in the data bit and the second binary value being stored in the mask bit.

* * * * *